United States Patent
Shim et al.

(10) Patent No.: US 12,446,414 B2
(45) Date of Patent: Oct. 14, 2025

(54) DISPLAY DEVICE AND ELECTRONIC APPARATUS

(71) Applicant: Samsung Display Co., Ltd., Yongin-si (KR)

(72) Inventors: Yongsub Shim, Yongin-si (KR); Younho Han, Yongin-si (KR); Jongbeom Hong, Yongin-si (KR); Reehyang Kim, Yongin-si (KR); Youngjun Yoo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 261 days.

(21) Appl. No.: 17/444,618

(22) Filed: Aug. 6, 2021

(65) Prior Publication Data

US 2022/0140014 A1 May 5, 2022

(30) Foreign Application Priority Data

Nov. 5, 2020 (KR) .................... 10-2020-0147092

(51) Int. Cl.

| | |
|---|---|
| *H10K 59/126* | (2023.01) |
| *H10K 50/858* | (2023.01) |
| *H10K 50/86* | (2023.01) |
| *H10K 59/121* | (2023.01) |
| *H10K 59/80* | (2023.01) |

(52) U.S. Cl.
CPC ......... *H10K 59/126* (2023.02); *H10K 50/858* (2023.02); *H10K 50/865* (2023.02); *H10K 59/121* (2023.02); *H10K 59/80516* (2023.02)

(58) Field of Classification Search
None
See application file for complete search history.

(56) References Cited

U.S. PATENT DOCUMENTS

| | | |
|---|---|---|
| 9,093,660 B2 | 7/2015 | Yang et al. |
| 9,306,190 B2 | 4/2016 | Kim et al. |
| 10,199,507 B2 | 2/2019 | Jeon et al. |
| 10,700,309 B2 | 6/2020 | Kim et al. |
| 11,227,907 B2 | 1/2022 | Bae et al. |
| 2016/0049615 A1* | 2/2016 | Kim ............... H10K 50/865 257/40 |
| 2017/0123250 A1* | 5/2017 | Wada ............ H01L 29/78633 |
| 2017/0155095 A1* | 6/2017 | Tsai ............... H10K 50/865 |
| 2020/0105844 A1* | 4/2020 | Wang ............. H10K 59/131 |

(Continued)

FOREIGN PATENT DOCUMENTS

| | | |
|---|---|---|
| KR | 10-0202546 B1 | 6/1999 |
| KR | 10-2014-0107091 A | 9/2014 |

(Continued)

*Primary Examiner* — Jessica S Manno
*Assistant Examiner* — Christopher A. Schodde
(74) *Attorney, Agent, or Firm* — Womble Bond Dickinson (US) LLP

(57) ABSTRACT

Provided is a display device including a substrate including a first display area, a second display area including transmission areas, and a non-display area, main pixel electrodes above the first display area, auxiliary pixel electrodes above the second display area, and a shield layer between the substrate and the auxiliary pixel electrodes, including a first metal layer, and at least one reflection reduction layer overlapping the first metal layer, and defining an opening overlapping the transmission areas.

11 Claims, 15 Drawing Sheets

(56) References Cited

U.S. PATENT DOCUMENTS

| | | | |
|---|---|---|---|
| 2020/0227494 A1 | 7/2020 | Bae et al. | |
| 2020/0258967 A1* | 8/2020 | Kim | ........................ H10K 59/17 |
| 2020/0273927 A1* | 8/2020 | Oh | ........................ H10K 59/121 |
| 2020/0295300 A1* | 9/2020 | Chung | .................. H10K 59/124 |

FOREIGN PATENT DOCUMENTS

| | | |
|---|---|---|
| KR | 10-1480928 B1 | 1/2015 |
| KR | 10-2016-0021330 A | 2/2016 |
| KR | 10-2017-0078075 A | 7/2017 |
| KR | 10-2018-0003244 A | 1/2018 |
| KR | 10-2093192 B1 | 3/2020 |
| KR | 10-2020-0089380 A | 7/2020 |
| KR | 10-2020-0090299 A | 7/2020 |

\* cited by examiner

DISPLAY DEVICE AND ELECTRONIC APPARATUS

CROSS-REFERENCE TO RELATED APPLICATION

This application claims priority to, and the benefit of, Korean Patent Application No. 10-2020-0147092, filed on Nov. 5, 2020, in the Korean Intellectual Property Office, the entire contents of which are hereby incorporated by reference.

BACKGROUND

1. Field

One or more embodiments relate to display devices having transmission areas and electronic apparatuses including the display devices.

2. Description of Related Art

Recently, the use of a display device has become wider. Furthermore, as the thickness and weight of a display device decrease, the range of use thereof is expanding.

While expanding an area occupied by a display area in a display device, various functions combined with, or linked to, the display device are added. As a method of expanding the area and adding various functions, a display device having an area in the display area that is not only for a function of displaying an image, but is also for various functions, has been continuously developed.

SUMMARY

A display device and an electronic apparatus according to the related art have a problem in that the display quality or component performance deteriorates due to reflected light.

One or more embodiments of the present disclosure include a high quality display device, which have a transmission area for transmitting light as an area for adding various functions located in a display area, and an electronic apparatus including the display device. However, this is merely an example, and the scope of the disclosure is not limited thereto.

Additional aspects will be set forth in part in the description which follows and, in part, will be apparent from the description, or may be learned by practice of the presented embodiments of the disclosure.

According to an aspect of one or more embodiments, a display device includes a substrate including a first display area, a second display area including transmission areas, and a non-display area, main pixel electrodes above the first display area, auxiliary pixel electrodes above the second display area, and a shield layer between the substrate and the auxiliary pixel electrodes, including a first metal layer, and at least one reflection reduction layer overlapping the first metal layer, and defining an opening overlapping the transmission areas.

The at least one reflection reduction layer may include a light-absorbing layer between the first metal layer and the substrate, and having a light absorption rate that is greater than a light absorption rate of the first metal layer.

The light-absorbing layer may include amorphous silicon.

When viewed in a direction that is perpendicular to an upper surface of the substrate, an edge of the first metal layer may be aligned with an edge of the light-absorbing layer.

The at least one reflection reduction layer may include a second metal layer under the first metal layer, and an inorganic material layer between the first metal layer and the second metal layer.

A thickness of the second metal layer in a direction that is perpendicular to an upper surface of the substrate may be less than a thickness of the first metal layer in the same direction.

The first metal layer and the second metal layer may include a same material.

The at least one reflection reduction layer may further include a light-absorbing layer between the first metal layer and the inorganic material layer, and having a light absorption rate that is greater than a light absorption rate of the first metal layer.

The light-absorbing layer may include amorphous silicon.

When viewed in a direction that is perpendicular to an upper surface of the substrate, an edge of the first metal layer may be aligned with an edge of the light-absorbing layer and with an edge of the inorganic material layer.

The substrate may include a first base layer, a first barrier layer on the first base layer, a second base layer on the first barrier layer, a second barrier layer on the second base layer, and a third barrier layer on the second barrier layer, and having a refractive index that is less than a refractive index of the second barrier layer.

The at least one reflection reduction layer may include a high refractive layer between the first metal layer and the third barrier layer, and having a refractive index that is greater than a refractive index of the third barrier layer.

A difference between a refractive index of the third barrier layer and a refractive index of the second barrier layer may be greater than or equal to about 0.3, wherein a difference between the refractive index of the third barrier layer and a refractive index of the high refractive layer is greater than or equal to about 0.3.

When viewed in a direction that is perpendicular to an upper surface of the substrate, an edge of the high refractive layer may be aligned with an edge of the first metal layer.

The at least one reflection reduction layer may further include a light-absorbing layer between the first metal layer and the high refractive layer, and having a light absorption rate that is greater than a light absorption rate of the first metal layer.

The light-absorbing layer may include amorphous silicon.

When viewed in a direction that is perpendicular to an upper surface of the substrate, an edge of the first metal layer may be aligned with an edge of the light-absorbing layer and an edge of the high refractive layer.

The display device may further include a lower surface absorption layer on a lower surface of the substrate, and overlapping the shield layer when viewed in a direction that is perpendicular to an upper surface of the substrate.

The lower surface absorption layer may include a molybdenum tantalum oxide (MTO).

The display device may further include a lower surface inorganic material layer on a lower surface of the lower surface absorption layer.

According to another aspect of one or more embodiments, an electronic apparatus includes a display panel including a first display area, a second display area including transmission areas, and a non-display area, and a component overlapping the second display area, wherein the display panel includes a substrate, main pixel electrodes above the first display area, auxiliary pixel electrodes above the second display area, and a shield layer between the substrate and the auxiliary pixel electrodes, including a first metal layer and at least one reflection reduction layer overlapping the first metal layer, and defining an opening overlapping the transmission areas.

The at least one reflection reduction layer may include a light-absorbing layer between the first metal layer and the substrate, and having a light absorption rate that is greater than a light absorption rate of the first metal layer.

The at least one reflection reduction layer may include a second metal layer under the first metal layer, and an inorganic material layer between the first metal layer and the second metal layer.

The substrate may include a first base layer, a first barrier layer on the first base layer, a second base layer on the first barrier layer, a second barrier layer on the second base layer, and a third barrier layer on the second barrier layer, and having a refractive index less than a refractive index of the second barrier layer, wherein the at least one reflection reduction layer includes a high refractive layer between the first metal layer and the third barrier layer, and having a refractive index that is greater than a refractive index of the third barrier layer.

The display panel may further include a lower surface absorption layer on a lower surface of the substrate, and overlapping the shield layer when viewed in a direction that is perpendicular to an upper surface of the substrate.

BRIEF DESCRIPTION OF THE DRAWINGS

The above and other aspects of certain embodiments of the disclosure will be more apparent from the following description taken in conjunction with the accompanying drawings, in which.

DETAILED DESCRIPTION

Figure 1:
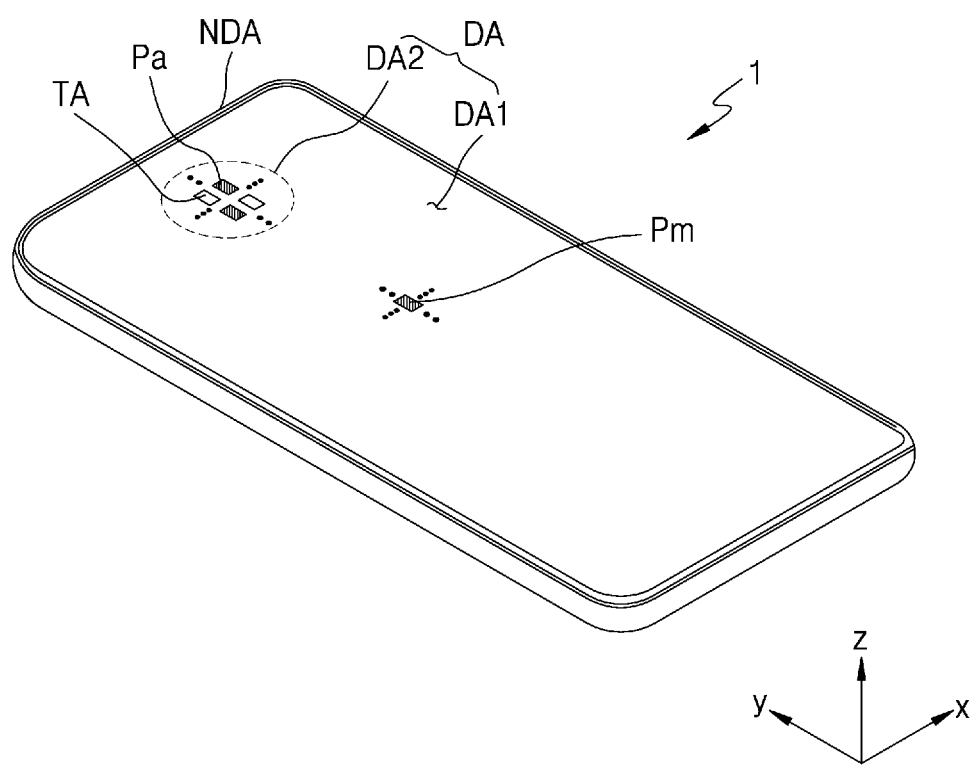
FIG. 1 is a schematic perspective view of a display device according to some embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

The disclosure will now be described more fully with reference to the accompanying drawings, in which embodiments of the disclosure are shown. Throughout the drawings, like reference numerals denote like elements. In the following description, when detailed descriptions about related well-known functions or structures are determined to make the gist of the disclosure unclear, the detailed descriptions will be omitted herein.

In the following embodiments, terms such as "first" and "second" are used herein merely to describe a variety of constituent elements, but the constituent elements are not limited by the terms. Such terms are used only for the purpose of distinguishing one constituent element from another constituent element.

In the following embodiments, an expression used in a singular form in the specification also includes the expression in its plural form unless clearly specified otherwise in context.

In the following embodiments, terms such as "include" or "comprise" may be construed to denote a certain characteristic or constituent element, but may not be construed to exclude the existence of or a possibility of addition of one or more other characteristics or constituent elements.

In the following embodiments, it will be understood that when a component, such as a layer, a film, a region, or a plate, is referred to as being "on" another component, the component can be directly on the other component or intervening components may be present thereon.

In the drawings, sizes of components may be exaggerated or reduced for convenience of explanation. For example, since sizes and thicknesses of components in the drawings are arbitrarily illustrated for convenience of explanation, the following embodiments are not limited thereto.

When embodiments may be implemented differently, a specific process order may be performed differently from the described order. For example, two consecutively described processes may be performed substantially at the same time or performed in an order opposite to the described order.

In the specification, the expressions such as "A or B," "at least one of A and/or B." And, "at least one or more of A and/or B" may include all available combinations of items listed together.

In the following embodiments, it will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, embodiments of the disclosure are described in detail with reference to the accompanying drawings.

FIG. 1 is a schematic perspective view of a display device 1 according to some embodiments.

As illustrated in FIG. 1, the display device 1 according to some embodiments may include a display area DA and a non-display area NDA.

The display area DA may include a first display area DA1 for displaying a main image, and a second display area DA2 for displaying an auxiliary image. The first display area DA1 may surround or partially surround at least a part of the second display area DA2. For example, the first display area DA1 may entirely surround the second display area DA2. The first display area DA1 and the second display area DA2 may display an image separately or together. The non-display area NDA, which is an area where no display element is arranged, may be an area that does not display an image. The non-display area NDA may surround at least a part of the display area DA. For example, the non-display area NDA may entirely surround the display area DA.

The display device 1 having the first display area DA1, the second display area DA2, and the non-display area NDA may be understood as a substrate 100 (see FIG. 2) of the display device 1 having the first display area DA1, the second display area DA2, and the non-display area NDA.

FIG. 1 illustrates that, when viewed in a direction approximately perpendicular to an upper surface of the display device 1, the second display area DA2 having an approximately circular shape is arranged at the center (e.g., with respect to the x-axis) at an upper side (+y direction) in the first display area DA1, and is entirely surrounded by the first display area DA1, but the disclosure is not limited thereto. For example, in some embodiments, the second display area DA2 may be located in an upper right or upper left side in the first display area DA1. Furthermore, the second display area DA2 may be located at one side of the display device 1 as a bar or notch-type. In this state, one edge of the second display area DA2 may match one edge of the first display area DA1. In other embodiments, the display device 1 may include a plurality of second display areas as the second display area DA2. The shapes and sizes of the second display areas DA2 may be different from each other.

For example, when viewed in a direction approximately perpendicular to the upper surface of the display device 1, the second display area DA2 may have various shapes, such as a circle, an oval, a polygon such as a rectangle, and the like, a star, or a diamond, and the like.

The display device 1 may include a plurality of main sub-pixels Pm arranged in the first display area DA1 and a plurality of auxiliary sub-pixels Pa arranged in the second display area DA2.

The auxiliary sub-pixels Pa arranged in the second display area DA2 emit light, thereby providing a corresponding image. An image displayed in the second display area DA2, which may be an auxiliary image, may have a lower resolution than an image displayed in the first display area DA1. In some embodiments, the second display area DA2 may be provided with a plurality of transmission areas TA through which light and/or sound is transmitted. Sub-pixels may be omitted from the transmission areas TA. Accordingly, the number of the auxiliary sub-pixels Pa to be arranged in the second display area DA2 per unit area may be relatively less than the number of the main sub-pixels Pm arranged in the first display area DA1 per unit area.

In the following description, an organic light-emitting display is described as an example of the display device 1 according to some embodiments. However, the display device of the disclosure is not limited thereto. In other words, the display device 1 of the disclosure may include a display device such as an inorganic light-emitting display or a quantum-dot light-emitting display device. For example, a light-emitting layer of a display element provided in the display device 1 may include an organic material or an inorganic material. The display device 1 may include quantum dots, an organic material and quantum dots, or an inorganic material and quantum dots.

Figure 2:
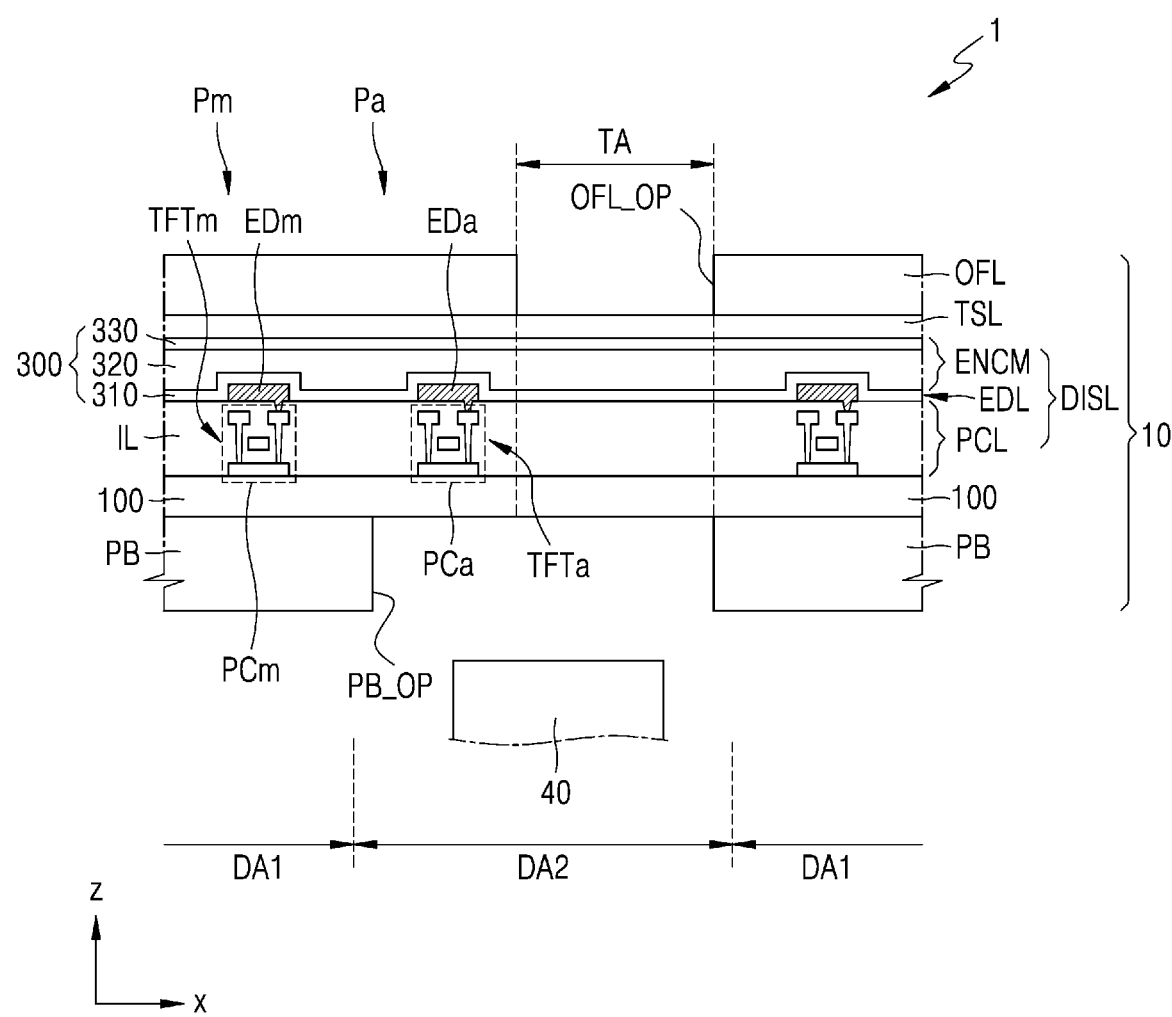
FIG. 2 is a schematic cross-sectional view of a portion of a display device according to some embodiments.

FIG. 2 is a schematic cross-sectional view of a portion of a display device according to some embodiments.

As illustrated in FIG. 2, the display device 1 may include a display panel 10 and a component 40 arranged to overlap the display panel 10. Furthermore, in some embodiments, the display device 1 may further include cover window arranged above the display panel 10 to protect the display panel 10.

The component 40 may be an electronic element located under the display panel 10 to correspond to the second display area DA2. In some embodiments, the component 40 may be an electronic element using light and/or sound. For example, the component 40 may be a sensor for measuring a distance, such as a proximity sensor, or a sensor for identifying a part of a body of a user, such as fingerprint, iris, face, and the like. Furthermore, the component 40 may be a compact lamp for outputting light, or an image sensor for capturing an image, such as a camera.

When the component 40 is an electronic element using light, light of various wavelength bands, such as visible light, infrared light, ultraviolet light, and the like. The component 40 may be an electronic element using ultrasound waves, or sound of some other frequency band. In some embodiments, the component 40 may include sub-components, such as an emission unit and a light receiving unit. The emission unit and the light receiving unit may constitute an integrated structure, or a pair of the emission unit and the light receiving unit in a physically separated structure may constitute the component 40 as a single body. To reduce or prevent a limitation of a function of the component 40, the second display area DA2 may include the transmission areas TA through which light and/or sound and the like output from the component 40 to the outside, or proceeding from the outside toward the component 40, is transmitted.

The display panel 10 may include the second display area DA2 that is an area overlapping the component 40, and the first display area DA1 that surrounds at least a part of the second display area DA2. The display panel 10 may include a substrate 100, a display layer DISL on the substrate 100, a function layer arranged above the display layer DISL, and a panel protection member PB arranged under the substrate 100. Although FIG. 2 illustrates a touch screen layer TSL and an optical function layer OFL as examples of the function layer, the disclosure is not limited thereto, and various function layers may be arranged according to a design.

The display layer DISL may include a circuit layer PCL, a display element layer EDL, and a sealing member ENCM. The circuit layer PCL may include a plurality of thin film transistors. In detail, the circuit layer PCL may include at least one main thin film transistor TFTm located in the first display area DA1, and at least one auxiliary thin film transistor TFTa located in the second display area DA2. The display element layer EDL may include a light-emitting element that is a display element. In detail, the display element layer EDL may include at least one main light-emitting element EDm located in the first display area DA1, and at least one auxiliary light-emitting element EDa located in the second display area DA2. The sealing member ENCM may include an encapsulation layer 300 or an encapsulation substrate. An insulating layer IL may be located in the display layer DISL, and the like.

The substrate 100 may include an insulating material, such as glass, quartz, polymer resin, and the like. The substrate 100 may be a rigid substrate or a flexible substrate capable of bending, folding, rolling, and the like.

In the first display area DA1, a main sub-pixel Pm may be arranged above the substrate 100. In detail, in the first display area DA1, the main light-emitting element EDm included in the main sub-pixel Pm, and a main pixel circuit PCm electrically connected thereto, may be arranged above the substrate 100. The main pixel circuit PCm may include at least one main thin film transistor TFTm, and may control the operation of the main light-emitting element EDm.

In the second display area DA2, an auxiliary sub-pixel Pa may be arranged above the substrate 100. In detail, in the second display area DA2, the auxiliary light-emitting element EDa included in the auxiliary sub-pixel Pa, and an auxiliary pixel circuit PCa electrically connected thereto, may be arranged above the substrate 100. The auxiliary pixel circuit PCa may include at least one auxiliary thin film transistor TFTa, and may control the operation of the auxiliary light-emitting element EDa.

In the second display area DA2, an area where the auxiliary light-emitting element EDa is arranged may be defined to be an auxiliary display area, and an area where the auxiliary light-emitting element EDa is not arranged may be defined to be the transmission area TA.

The transmission area TA may be an area where light/signal emitted from the component 40 arranged to correspond to the second display area DA2, or light/signal incident on the component 40, is transmitted. Although FIG. 2 illustrates, for convenience of explanation, one auxiliary pixel circuit PCa, one auxiliary light-emitting element EDa, and one transmission area TA are arranged in the second display area DA2, the disclosure is not limited thereto. Multiple auxiliary pixel circuits PCa, auxiliary light-emitting elements EDa, and transmission areas TA may be arranged in the second display area DA2. In some embodiments, the auxiliary light-emitting elements EDa and the transmission areas TA may be alternately arranged in the second display area DA2. In other words, respective auxiliary light-emitting elements EDa may be arranged between the transmission areas TA in the second display area DA2.

The encapsulation layer 300, as the sealing member ENCM, may be located above the display element layer EDL. In some embodiments, the encapsulation layer 300 may include at least one inorganic encapsulation layer and at least one organic encapsulation layer covering the display element layer EDL. For example, as illustrated in FIG. 2, the encapsulation layer 300 may include a first inorganic encapsulation layer 310, a second inorganic encapsulation layer 330, and an organic encapsulation layer 320 interposed therebetween.

The first inorganic encapsulation layer 310 and the second inorganic encapsulation layer 330 may include one or more inorganic insulating materials, such as a silicon oxide ($SiO_2$), a silicon nitride ($SiN_x$), a silicon oxynitride ($Si_xN_y$), an aluminum oxide ($Al_2O_3$), a titanium oxide ($TiO_2$), a tantalum oxide ($Ta_2O_5$), a hafnium oxide ($HfO_2$), or a zinc oxide ($ZnO_2$), and may be formed by a chemical vapor deposition (CVD) method, and the like. The organic encapsulation layer 320 may include a polymer-based material. The polymer-based material may include silicon-based resin, acryl-based resin, for example, polymethyl methacrylate, polyacryl acid, and the like, epoxy-based resin, polyimide, polyethylene, and the like. The first inorganic encapsulation layer 310, the organic encapsulation layer 320, and the second inorganic encapsulation layer 330 may be integrally formed with each other to cover the first display area DA1 and the second display area DA2.

The disclosure is not limited thereto, and in other embodiments, the display panel 10 may include an encapsulation substrate located above the display element layer EDL as the sealing member ENCM. In this case, the encapsulation substrate may be arranged to face the substrate 100 with the display element layer EDL therebetween. A gap may exist between the encapsulation substrate and the display element layer EDL. The encapsulation substrate may include glass. A sealant including frit may be arranged between the substrate 100 and the encapsulation substrate, and the sealant may be arranged in the above-described non-display area NDA. The sealant arranged in the non-display area NDA may surround the display area DA to reduce or prevent intrusion of moisture through a side surface.

The touch screen layer TSL may obtain an external input, for example, coordinate information according to a touch event. The touch screen layer TSL may include a touch electrode and touch wirings connected to the touch electrode. The touch screen layer TSL may detect an external input in a self-capacitance method or a mutual capacitance method.

The touch screen layer TSL may be located above the sealing member ENCM. In some embodiments, the touch screen layer TSL may be separately formed on a touch substrate, and then bonded to the encapsulation layer 300 through an adhesive layer, such as an optically clear adhesive. In other embodiments, the touch screen layer TSL may be formed directly on the encapsulation layer 300. In this case, the adhesive layer might not be interposed between the touch screen layer TSL and the encapsulation layer 300.

The optical function layer OFL may include an anti-reflection layer. The anti-reflection layer may reduce reflectivity of external light incident on the display device 1. For example, the optical function layer OFL may be a polarized film. The optical function layer OFL may have an opening OFL_OP corresponding to the transmission area TA. Accordingly, light transmittance of the transmission area TA may be remarkably improved. The opening OFL_OP may be filled with a transparent material, such as optically clear resin (OCR). Alternatively, the optical function layer OFL may be implemented by a filter plate including a black matrix and color filters.

The panel protection member PB may be attached to a lower portion of the substrate 100 to support and protect the substrate 100. The panel protection member PB may have an opening PB_OP corresponding to the second display area DA2. As the panel protection member PB has the opening PB_OP, light transmittance of the second display area DA2 may be improved. The panel protection member PB may include polyethylene terephthalate or polyimide. In other embodiments, the panel protection member PB might not have the opening PB_OP. Furthermore, in other embodiments, the panel protection member PB may be omitted.

The area of the second display area DA2 may be greater than the area where the component 40 is arranged. Accordingly, the area of the opening PB_OP of the panel protection member PB might not match the area of the second display area DA2. Although FIG. 2 illustrates that the component 40 is located at one side of the display panel 10 apart from the display panel 10, at least a part of the component 40 may be inserted into the opening PB_OP provided in the panel protection member PB.

Furthermore, the component 40 may include a plurality of components that are arranged in the second display area DA2. In this case the components 40 may have functions that are different from each other. For example, the components 40 may include at least two of a camera/imaging device, a solar cell, a flash, a proximity sensor, an illuminance sensor, and an iris sensor.

The display panel 10 may be provided in various electronic apparatuses, such as a mobile phone, a tablet PC, a notebook, a smart watch, and the like. In other words, an electronic apparatus may include the display panel 10 and the component 40 according to some embodiments.

Figure 3:
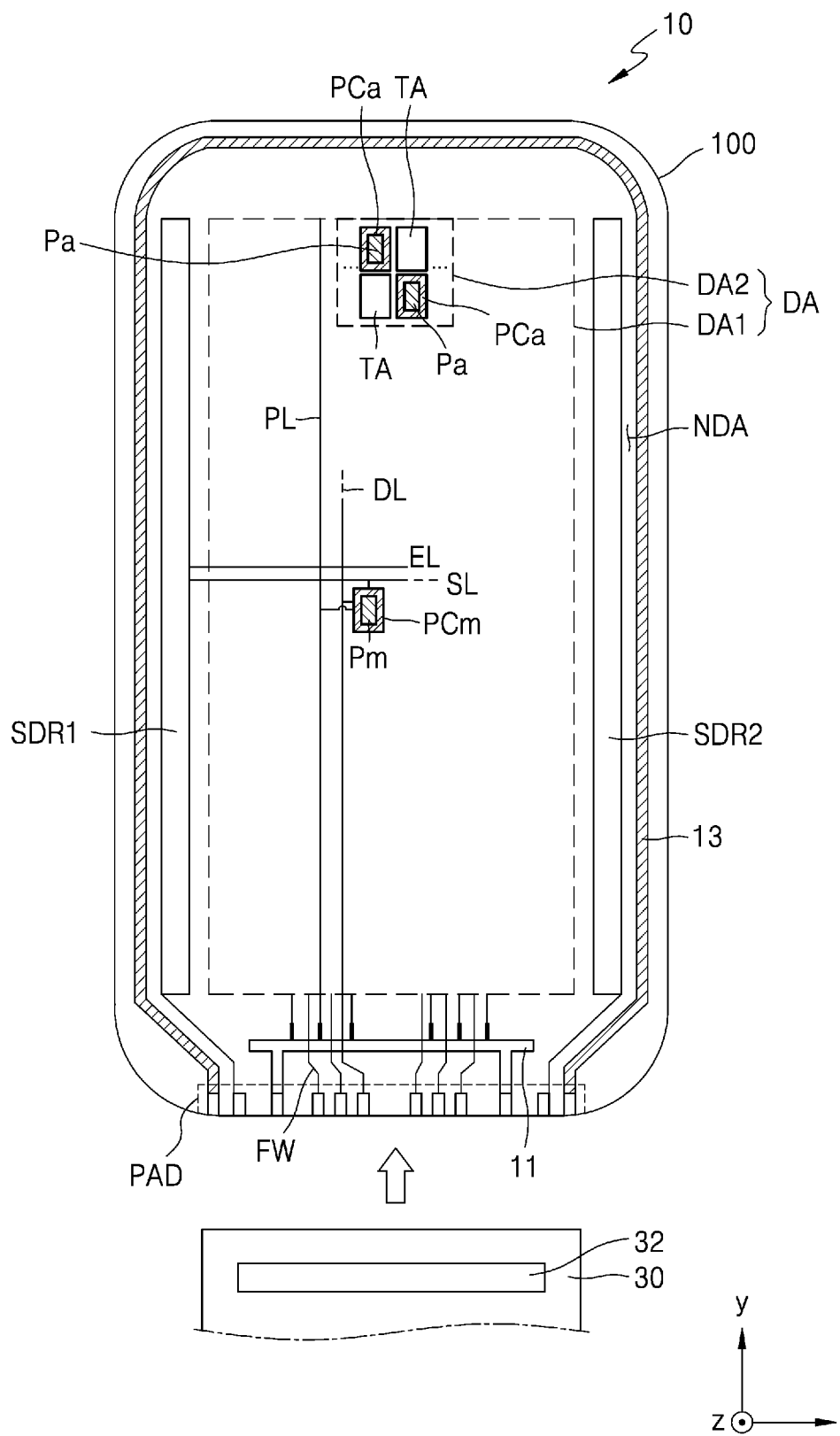
FIG. 3 is a schematic plan view of a portion of a display panel of a display device according to some embodiments.

FIG. 3 is a schematic plan view of a portion of a display panel of a display device according to some embodiments.

Referring to FIG. 3, various constituent elements constituting the display panel 10 may be arranged above the substrate 100.

The main sub-pixels Pm may be arranged in the first display area DA1. The main sub-pixels Pm each may be implemented using a display element, such as an organic light-emitting diode (OLED). The main pixel circuit PCm for driving the main sub-pixel Pm may be arranged in the first display area DA1. The main pixel circuit PCm may be arranged to overlap the main sub-pixel Pm. Each main sub-pixel Pm may emit, for example, red, green, blue, or white light. The first display area DA1 may be covered with the sealing member ENCM (see FIG. 2), to be protected from external air, moisture, and the like.

The second display area DA2, as described above, may be located at one side of the first display area DA1, or inside the display area DA, to be surrounded or partially surrounded by the first display area DA1. The auxiliary sub-pixels Pa are arranged in the second display area DA2. The auxiliary sub-pixels Pa each may be implemented by a display element such as OLED. The auxiliary pixel circuit PCa for driving the auxiliary sub-pixel Pa may be arranged in the second display area DA2. The auxiliary pixel circuit PCa may be arranged to overlap the auxiliary sub-pixel Pa. Each auxiliary sub-pixel Pa may emit, for example, red, green, blue, or white light. The second display area DA2 may be covered with the sealing member ENCM (see FIG. 2) along with the first display area DA1, to be protected from external air, moisture, and the like.

As described above, the second display area DA2 may include multiple transmission areas TA. The transmission areas TA may be respectively arranged to surround the auxiliary sub-pixels Pa. Alternatively, the transmission areas TA may be respectively arranged in the form of a lattice with the auxiliary sub-pixels Pa. As the second display area DA2 includes the transmission areas TA, the second display area DA2 may have a lower resolution than the first display area DA1. For example, the resolution of the second display area DA2 may be about ½, about ⅜, about ⅓, about ¼, about ²⁄₉, about ⅛, about ⅑, or about ¹⁄₁₆ less than the resolution of the first display area DA1.

Each of the pixel circuits PCm and PCa for respectively driving the sub-pixels Pm and Pa may be electrically connected to outer circuits arranged in the non-display area NDA. A first scan driving circuit SDR1, a second scan driving circuit SDR2, a pad portion PAD, a driving voltage supply line 11, and a common voltage supply line 13 may be arranged in the non-display area NDA.

The first scan driving circuit SDR1 and the second scan driving circuit SDR2 may be symmetrically arranged with respect to the first display area DA1. The first scan driving circuit SDR1 and the second scan driving circuit SDR2 may apply a scan signal to the main pixel circuit PCm for driving the main sub-pixel Pm via a scan line SL. Furthermore, the first scan driving circuit SDR1 and the second scan driving circuit SDR2 may apply an emission control signal to each pixel circuit via an emission control line EL. A part of the main pixel circuit PCm of the main sub-pixel Pm of the first display area DA1 may be electrically connected to the first scan driving circuit SDR1, and the other may be electrically connected to the second scan driving circuit SDR2.

The pad portion PAD may be arranged at a side of the substrate 100. The pad portion PAD may be exposed without being covered by an insulating layer so as to be electrically connected to a display circuit board 30. A display driver 32 may be arranged on the display circuit board 30.

The display driver 32 may generate a control signal to be transmitted to the first scan driving circuit SDR1 and the second scan driving circuit SDR2. The display driver 32 may generate a data signal, and the generated data signal may be transmitted to the main pixel circuit PCm via a fan-out wiring FW, and a data line DL connected to the fan-out wiring FW.

The display driver 32 may supply a driving voltage ELVDD to the driving voltage supply line 11, and a common voltage ELVSS to the common voltage supply line 13. The driving voltage ELVDD may be applied to the pixel circuit of the sub-pixels Pm and Pa via a driving voltage line PL connected to the driving voltage supply line 11, and the common voltage ELVSS may be applied to a counter electrode of the display element via the common voltage supply line 13.

The driving voltage supply line 11 may be provided to extend in an x direction under the first display area DA1. The common voltage supply line 13 may have a shape of a loop with one side open, and may partially surround the first display area DA1.

Although FIG. 3 illustrates a case in which the second display area DA2 is singular, the display panel 10 may include a plurality of second display areas DA2. In this case, the second display areas DA2 may be arranged apart from each other, and a first camera may be arranged to correspond to one second display area DA2, while a second camera may be arranged to correspond to another second display area DA2. Alternatively, a camera may be arranged to correspond to one second display area DA2, and an infrared sensor may be arranged to correspond to the other second display area DA2. Furthermore, the shapes and sizes of the second display areas DA2 may be different from each other.

Figure 4:
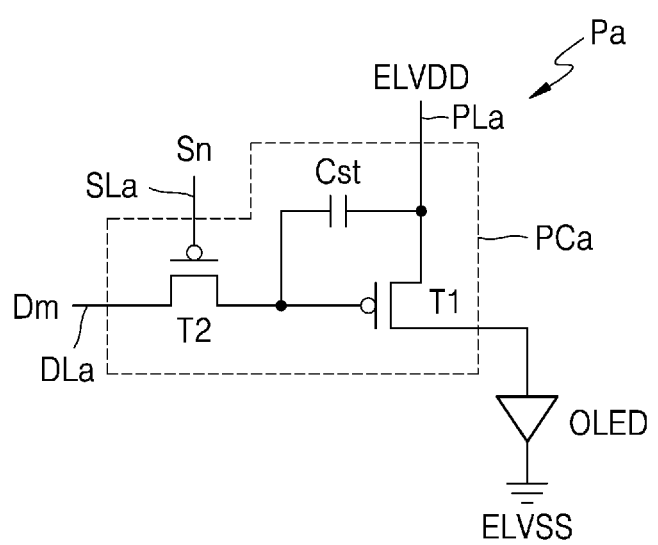
FIG. 4 is an equivalent circuit diagram of a pixel circuit of a display device according to some embodiments.

FIG. 4 is an equivalent circuit diagram of a pixel circuit of a display device according to some embodiments.

Referring to FIG. 4, the auxiliary sub-pixel Pa may include the auxiliary pixel circuit PCa, and the organic light-emitting diode OLED connected to the auxiliary pixel circuit PCa, as a display element. The main sub-pixel Pm may also include, as illustrated in FIG. 4, the main pixel circuit PCm that is the same as, or similar to, the auxiliary pixel circuit PCa and the organic light-emitting diode OLED as a display element connected thereto.

The auxiliary pixel circuit PCa may include a driving thin film transistor T1, a switching thin film transistor T2, and a storage capacitor Cst. The switching thin film transistor T2 is connected to an auxiliary scan line SLa and an auxiliary data line DLa, and transmits a data signal Dm input via the auxiliary data line DLa to the driving thin film transistor T1, in response to a scan signal Sn input via the auxiliary scan line SLa. The storage capacitor Cst is connected to the switching thin film transistor T2 and an auxiliary driving voltage line PLa, and stores a voltage corresponding to a difference between the voltage received from the switching thin film transistor T2 and the driving voltage ELVDD supplied to the auxiliary driving voltage line PLa.

The driving thin film transistor T1 is connected to the auxiliary driving voltage line PLa and the storage capacitor Cst, and controls a driving current flowing from the auxiliary driving voltage line PLa to the organic light-emitting diode OLED according to a voltage value stored in the storage capacitor Cst. The organic light-emitting diode OLED may emit light having a certain luminance by the driving current.

Although FIG. 4 illustrates a case in which the auxiliary pixel circuit PCa includes two thin film transistors and one storage capacitor, the disclosure is not limited thereto. In some embodiments, the auxiliary pixel circuit PCa may include seven thin film transistors and one storage capacitor. In other embodiments, the auxiliary pixel circuit PCa may include two or more storage capacitors.

Figure 5:
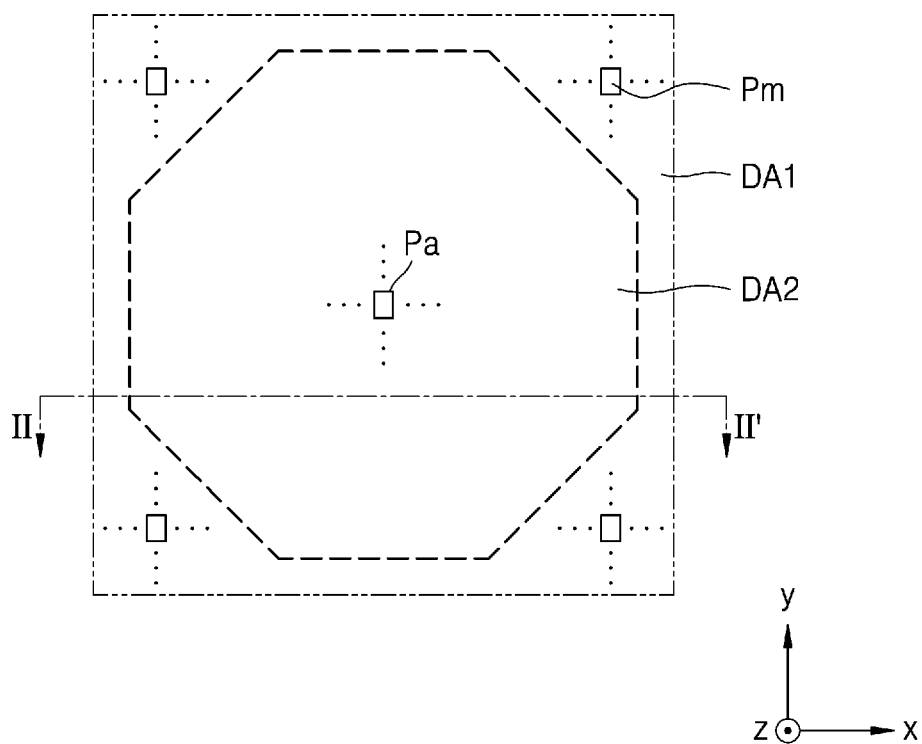
FIG. 5 is a schematic plan view of a portion of a display device according to some embodiments.

FIG. 5 is a schematic plan view of a portion of a display device according to some embodiments.

As illustrated in FIG. 5, the main sub-pixels Pm may be arranged in in the first display area DA1, and the auxiliary sub-pixels Pa may be arranged in the second display area DA2. Furthermore, in some embodiments and as described above, as the component 40 is arranged to overlap the second display area DA2, the second display area DA2 may include the transmission area TA.

The density of the auxiliary sub-pixels Pa of the second display area DA2 including the transmission area TA may be different from the density of the main sub-pixels Pm of the first display area DA1. For example, in the same area, the number and/or aperture ratio of pixels arranged in the second display area DA2 may be less than the number and/or aperture ratio of pixels arranged in the first display area DA1.

Figure 6:
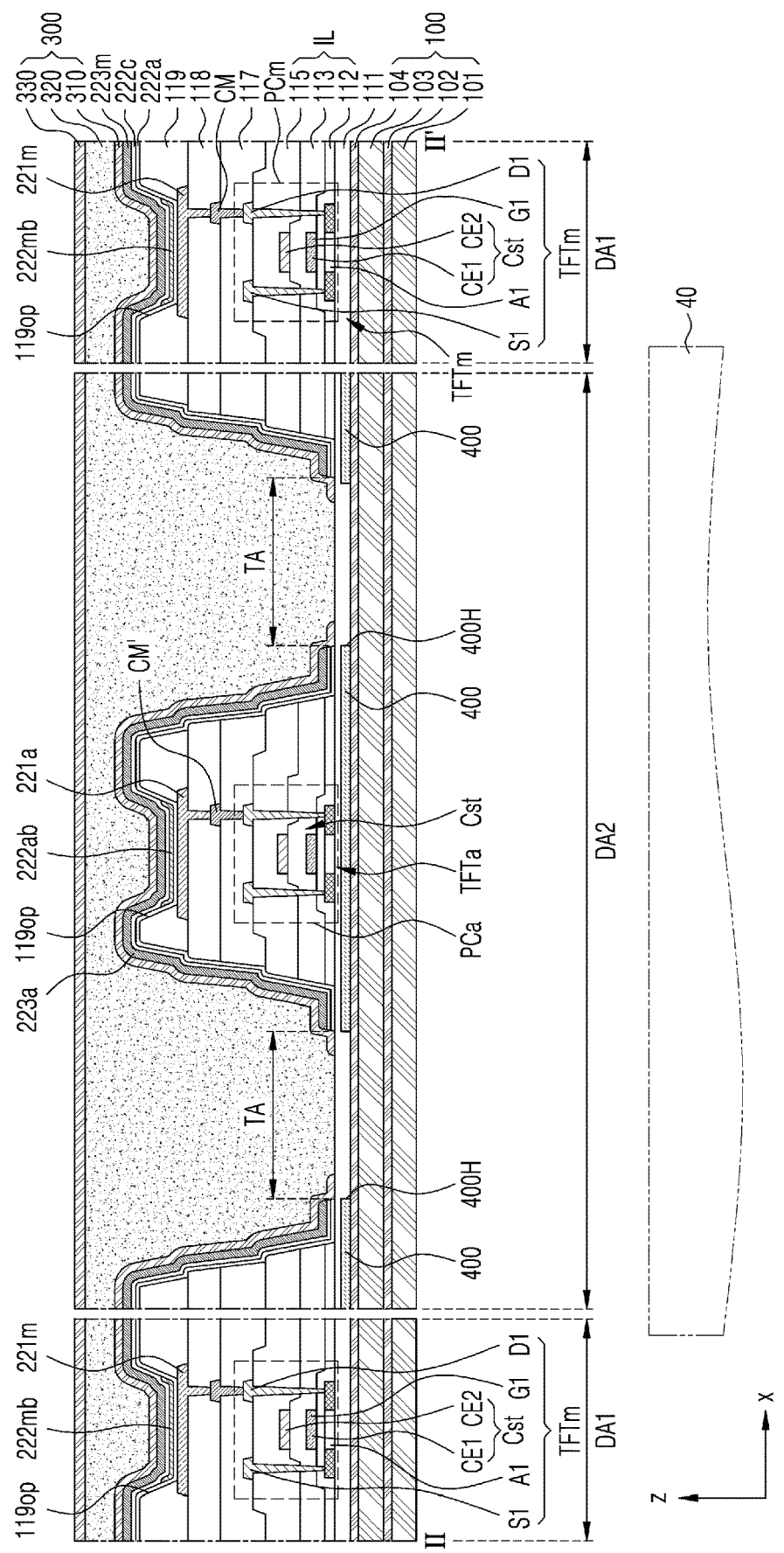
FIG. 6 is a schematic cross-sectional view of a portion of a display device taken along the line II-II' of FIG. 5 according to some embodiments.

FIG. 6 is a schematic cross-sectional view of a portion of a display device taken along the line II-II' of FIG. 5 according to some embodiments.

The substrate 100 may include various materials as described above, and may have a multilayer structure. In some embodiments, the substrate 100 may include a first base layer 101, a first barrier layer 102 on the first base layer 101, a second base layer 103 on the first barrier layer 102, and a second barrier layer 104 on the second base layer 103.

The first base layer 101 and the second base layer 103 each may include polymer resin. The polymer resin may include polyethersulfone, polyarylate, polyetherimide, polyethylene naphthalate, polyethylene terephthalate, polyphenylene sulfide, polyimide, polycarbonate, cellulose triacetate, cellulose acetate propionate, and the like. The polymer resin may be transparent.

The first barrier layer 102 and the second barrier layer 104 may be barrier layers for reducing or preventing intrusion of external foreign materials. The first barrier layer 102 and the second barrier layer 104 each may be a single layer or multilayered, and may include an inorganic material such as a silicon nitride, a silicon oxynitride, and/or a silicon oxide.

A buffer layer 111 may be located on the substrate 100. The buffer layer 111 may reduce or prevent intrusion of foreign materials, moisture, or external air from under the substrate 100, and may planarize an upper surface of the substrate 100. The buffer layer 111 may include an inorganic insulating material such as a silicon oxide, a silicon oxynitride, or a silicon nitride, and may have a single-layer or multilayer structure including the above-described material(s). In other embodiments, the buffer layer 111 may be omitted.

Pixel circuits including a thin film transistor TFT and a storage capacitor Cst may be located above the substrate 100. The main pixel circuit PCm may be located above the substrate 100 in the first display area DA1, and the auxiliary pixel circuit PCa may be located above the substrate 100 in the second display area DA2. The main pixel circuit PCm of the first display area DA1 and the auxiliary pixel circuit PCa of the second display area DA2 may have the same structure.

In some embodiments, a lower metal layer may be located between the substrate 100 and the main pixel circuit PCm in the first display area DA1. In this state, the buffer layer 111 may cover the lower metal layer, and may be located on the substrate 100. The lower metal layer may overlap at least a part of a main semiconductor layer A1 of the main thin film transistor TFTm. Accordingly, the lower metal layer may protect the main semiconductor layer A1 from external light. The lower metal layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and/or the like. Furthermore, the lower metal layer may be provided in a single layer or multilayer of the above-described material(s). Furthermore, the lower metal layer may include the same material as a shield layer 400 that is described later, and may have the same layer structure.

The shield layer 400 may be located between the substrate 100 and the auxiliary pixel circuit PCa in the second display area DA2. In this state, the buffer layer 111 may cover the shield layer 400, and may be located on the substrate 100. The shield layer 400 may reduce or prevent diffraction of light emitted from the component 40, or proceeding toward the component 40, through a narrow gap between the wrings connected to the auxiliary pixel circuit PCa, and may improve performance of the auxiliary thin film transistor TFTa. Furthermore, the shield layer 400 may improve uniformity in reflectivity by removing a reflectivity difference between one area, where wirings including a metal material and the like are arranged, and another area. The shield layer 400 may have a preset reflectivity by controlling a material included in the shield layer 400. The shield layer

400 may include at least one metal layer and at least one reflection reduction layer, which is described below in detail with reference to FIGS. 7 to 11.

The shield layer 400 might not be arranged in the transmission areas TA. For example, the shield layer 400 may have an opening 400H that overlaps the transmission areas TA. In other words, the openings 400H of the shield layer 400 may define the transmission areas TA of the second display area DA2.

The main thin film transistor TFTm of the main pixel circuit PCm located in the first display area DA1 may include the main semiconductor layer A1, a main gate electrode G1 overlapping a channel region of the main semiconductor layer A1, and a main source electrode S1 and a main drain electrode D1 respectively connected to a source region and a drain region of the main semiconductor layer A1. A gate insulating layer 112 may be provided between the main semiconductor layer A1 and the main gate electrode G1, and a first interlayer insulating layer 113 and a second interlayer insulating layer 115 may be arranged between the main gate electrode G1 and the main source electrode S1, and/or between the main gate electrode G1 and the main drain electrode D1.

The storage capacitor Cst may be arranged to overlap the main thin film transistor TFTm. The storage capacitor Cst may include a lower electrode CE1 and an upper electrode CE2 that overlap with each other. In some embodiments, the main gate electrode G1 of the main thin film transistor TFTm and the lower electrode CE1 of the storage capacitor Cst may be integrally formed with each other or may be the same. The first interlayer insulating layer 113 may be arranged between the lower electrode CE1 and the upper electrode CE2.

The main semiconductor layer A1 may include poly silicon. In some embodiments, the main semiconductor layer A1 may include amorphous silicon. In some embodiments, the main semiconductor layer A1 may include an oxide of at least one or more materials selected from the group consisting of indium (In), gallium (Ga), tin (Sn), zirconium (Zr), vanadium (V), hafnium (Hf), cadmium (Cd), germanium (Ge), chromium (Cr), titanium (Ti), and/or zinc (Zn). The main semiconductor layer A1 may include the channel region, and the source and drain regions that are doped with impurities.

The gate insulating layer 112 may include an inorganic insulating material, such as a silicon oxide, a silicon oxynitride, or a silicon nitride, and may have a single-layer or multilayer structure including the above material(s).

The main gate electrode G1 or the lower electrode CE1 may include a conductive material having low resistance such as molybdenum (Mo), aluminum (Al), copper (Cu), and/or titanium (Ti), and may have a single-layer or multilayer structure including the above-described material(s). For example, the main gate electrode G1 may have a 3-layer structure of molybdenum/aluminum/molybdenum.

The first interlayer insulating layer 113 may include an inorganic insulating material, such as a silicon oxide, a silicon oxynitride, or a silicon nitride, and may have a single-layer or multilayer structure including the above material(s).

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single-layer or multilayer structure including the above material(s).

The second interlayer insulating layer 115 may include an inorganic insulating material, such as a silicon oxide, a silicon oxynitride, or a silicon nitride, and may have a single-layer or multilayer structure including the above material(s).

The main source electrode S1 or the main drain electrode D1 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single-layer or multilayer structure including the above material(s). For example, the main source electrode S1 or the main drain electrode D1 may have a 3-layer structure of titanium/aluminum/titanium.

The main pixel circuit PCm including the main thin film transistor TFTm and the storage capacitor Cst may be electrically connected to a main pixel electrode 221m located above the substrate 100 in the first display area DA1. For example, the main pixel circuit PCm and the main pixel electrode 221m may be electrically connected to a contact metal CM that is a connection wiring.

The contact metal CM may be located on a first planarization layer 117, and may be connected to the main pixel circuit PCm via a contact hole formed in the first planarization layer 117. The contact metal CM may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single-layer or multilayer structure including the above material(s).

The first planarization layer 117 may include an organic insulating material. For example, the first planarization layer 117 may include an organic insulating material such as acryl, benzocyclobutene (BCB), polyimide, hexamethyldisiloxane (HMDSO), and the like. The organic insulating material of the first planarization layer 117 may be a photosensitive organic insulating material.

A second planarization layer 118 is located on the contact metal CM. The second planarization layer 118 may include an organic insulating material. The second planarization layer 118 may include an organic insulating material such as acryl, benzocyclobutene (BCB), polyimide, hexamethyldisiloxane (HMDSO), and/or the like. The organic insulating material of the second planarization layer 118 may include a photosensitive organic insulating material.

The main pixel electrode 221m may be located on the second planarization layer 118. The main pixel electrode 221m may be connected to the contact metal CM via a contact hole of the second planarization layer 118.

The main pixel electrode 221m may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. The main pixel electrode 221m may include a reflective film including the above material(s) and a transparent conductive film arranged above and/or under the reflective film. The transparent conductive film may include an indium tin oxide (ITO), an indium zinc oxide (IZO), a zinc oxide (ZnO), an indium oxide ($In_2O_3$), an indium gallium oxide (IGO), an aluminum zinc oxide (AZO), and the like. In some embodiments, the main pixel electrode 221m may have a 3-layer structure of ITO/Ag/ITO, which are sequentially stacked.

Although the main pixel circuit PCm and the main pixel electrode 221m located in the first display area DA1 are described above, the description may be applied to the auxiliary pixel circuit PCa and an auxiliary pixel electrode 221a that are located in the second display area DA2. In other words, the auxiliary thin film transistor TFTa of the auxiliary pixel circuit PCa located in the second display area DA2 may have a structure that is the same as, or similar to, the main thin film transistor TFTm of the main pixel circuit PCm, and the auxiliary pixel electrode 221a located in the second display area DA2 may have a structure that is the same as, or similar to, the main pixel electrode 221m. The auxiliary pixel electrode 221a is illustrated to be electrically connected by a contact metal CM', which is the connection wiring, to the auxiliary thin film transistor TFTa including an auxiliary semiconductor layer and an auxiliary gate electrode. The description about the above-described the contact metal CM may be applied to the contact metal CM'.

A pixel definition layer 119 may be arranged on the main pixel electrode 221m and the auxiliary pixel electrode 221a. The pixel definition layer 119 may include an opening 119OP that covers edges of the main pixel electrode 221m and the auxiliary pixel electrode 221a, and that overlaps the respective center portions of the main pixel electrode 221m and the auxiliary pixel electrode 221a. The pixel definition layer 119 may include an organic insulating material, such as polyimide, polyamide, acryl resin, benzocyclobutene, hexamethyldisiloxane (HMDSO), phenol resin, and/or the like.

A first function layer 222a and a second function layer 222c are located on the pixel definition layer 119, the main pixel electrode 221m, and the auxiliary pixel electrode 221a. Each of the first function layer 222a and the second function layer 222c may cover the first display area DA1 and the second display area DA2 as a whole. In other embodiments, the first function layer 222a and the second function layer 222c may have an opening corresponding to the transmission areas TA.

The first function layer 222a may be a single layer or multilayered. For example, when the first function layer 222a includes a polymer material, the first function layer 222a, as a hole transport layer (HTL) that is a single-layer structure, may include poly-(3,4)-ethylene-dihydroxy thiophene (PEDOT), or polyaniline. When the first function layer 222a may include a low molecular weight material, the first function layer 222a may include a hole injection layer (HIL) and a hole transport layer (HTL).

The second function layer 222c may be optional. For example, when the first function layer 222a, and the like includes a polymer material, the second function layer 222c may be located above the first function layer 222a. The second function layer 222c may be a single layer or multilayered. The second function layer 222c may include an electron transport layer (ETL) and/or an electron injection layer (EIL).

A main emission layer 222mb or an auxiliary emission layer 222ab is located on the first function layer 222a, or between the first function layer 222a and the second function layer 222c. The main emission layer 222mb may have a shape patterned to correspond to the main pixel electrode 221m, and the auxiliary emission layer 222ab may have a shape patterned to correspond to the auxiliary pixel electrode 221a. The main emission layer 222mb and the auxiliary emission layer 222ab may include an organic material. The main emission layer 222mb and the auxiliary emission layer 222ab may include a polymer organic material or a low molecular weight organic material that emits a certain color light.

An auxiliary counter electrode 223a that overlaps the auxiliary pixel electrode 221a is located above the auxiliary emission layer 222ab, and a main counter electrode 223m that overlaps the main pixel electrode 221m is located above and the main emission layer 222mb. The auxiliary counter electrode 223a and the main counter electrode 223m may be integrally formed with each other. The auxiliary counter electrode 223a and the main counter electrode 223m may include a conductive material having a relatively low work function. For example, the auxiliary counter electrode 223a and the main counter electrode 223m may include a (semi-) transparent layer including silver (Ag), magnesium (Mg), aluminum (Al), nickel (Ni), chromium (Cr), lithium (Li), calcium (Ca), an alloy thereof, and/or the like. Alternatively, the auxiliary counter electrode 223a and the main counter electrode 223m may further include a layer including ITO, IZO, ZnO, or $In_2O_3$ on the (semi-) transparent layer including the above-described material(s). In some embodiments, the auxiliary counter electrode 223a and the main counter electrode 223m may include silver (Ag) and magnesium (Mg).

A stacking structure of the main pixel electrode 221m, the main emission layer 222mb, and the main counter electrode 223m, which are sequentially stacked, may form a light-emitting diode, for example, an organic light-emitting diode OLED. A stacking structure of the auxiliary pixel electrode 221a, the auxiliary emission layer 222ab, and the auxiliary counter electrode 223a may also form a light-emitting diode, such as an organic light-emitting diode OLED. The organic light-emitting diode OLED may emit red, green, or blue light, and the emission area of the organic light-emitting diode OLED corresponds to a pixel. For example, the main sub-pixel Pm may correspond to the emission area of the organic light-emitting diode OLED arranged in the first display area (DA1), and the auxiliary sub-pixel Pa may correspond to the emission area of the organic light-emitting diode OLED arranged in the second display area DA2. As the opening 119OP of the pixel definition layer 119 defines the size and/or width of the emission area, the sizes and/or widths of the main sub-pixel Pm and the auxiliary sub-pixel Pa may be dependent on the opening 119OP of the pixel definition layer 119.

The organic light-emitting diode OLED may be covered by the first inorganic encapsulation layer 310, the second inorganic encapsulation layer 330, and the organic encapsulation layer 320 interposed therebetween, as described above.

Referring to FIG. 6, the insulating layers on the substrate 100 may respectively include holes formed to correspond to the transmission areas TA. For example, as illustrated in FIG. 6, the gate insulating layer 112, the first interlayer insulating layer 113, the second interlayer insulating layer 115, the first planarization layer 117, the second planarization layer 118, and the pixel definition layer 119 may respectively include holes formed to correspond to the transmission areas TA, and may overlap with each other.

In the second display area DA2 between the transmission areas TA, the above-described shield layer 400 may be located between the substrate 100 and the auxiliary pixel electrode 221a. The shield layer 400 may include at least one metal layer. A metal layer included in the shield layer 400 may reflect light coming from under the substrate 100. Part of light reflected from the metal layer of the shield layer 400 may arrive at the component 40 arranged under the substrate 100.

As a comparative example, part of light coming from above the substrate 100 may be reflected from a lens or the like of the component 40 in a direction toward the shield layer 400, and light reflected from the component 40 may be reflected back from the metal layer included in the shield layer 400 in a direction toward the component 40. The reflected lights arriving at the component 40 may deteriorate performance of the component 40, or moreover deteriorate display quality.

To reduce or prevent the likelihood of the above-described problems, the shield layer 400 according to one or more embodiments may include at least one reflection reduction layer. The reflection reduction layer may mean a layer that reduces reflection of the light arriving at the shield layer 400. In other words, the reflection reduction layer may reduce the reflectivity of the shield layer 400.

Various embodiments of the shield layer 400 are described below in detail with reference to FIGS. 7 to 11. However, like reference numerals denote like constituent elements through the drawings, and redundant descriptions are omitted.

Figure 7:
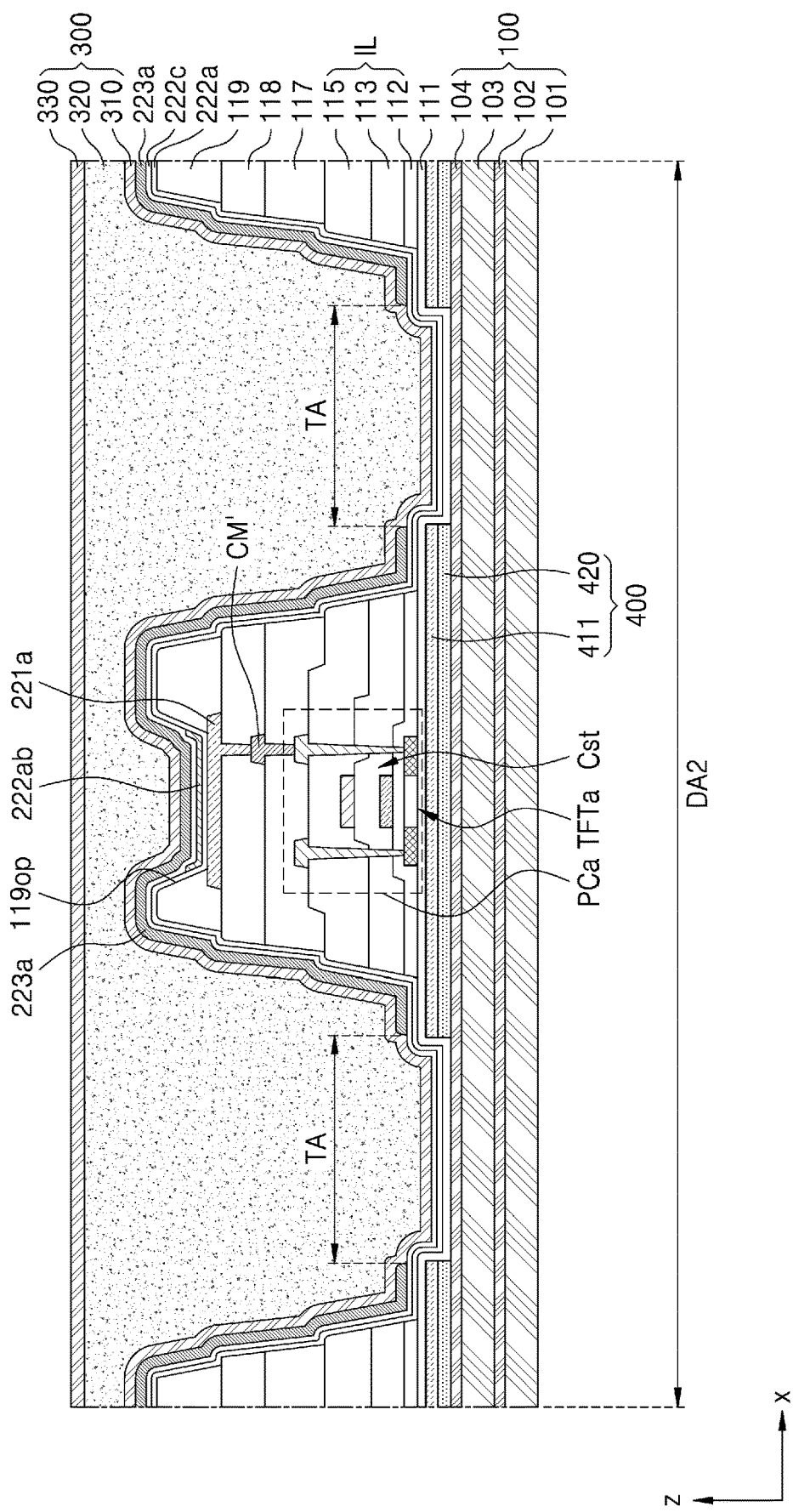
FIG. 7 is a schematic cross-sectional view of a portion of a shield layer of a display device according to some embodiments.

FIG. 7 is a schematic cross-sectional view of a portion of a shield layer of a display device according to some embodiments.

Referring to FIG. 7, the shield layer 400 may include a first metal layer 411, and a light-absorbing layer 420 located under the first metal layer 411 as the reflection reduction layer.

The first metal layer 411 may reduce or prevent the light emitted from the component 40, or proceeding toward the component 40, from diffracting through a fine gap between pixel circuits and/or wirings. The first metal layer 411 may include silver (Ag), aluminum (Al), platinum (Pt), palladium (Pd), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single-layer or multilayer structure including the above material(s).

The light-absorbing layer 420 may function as a reflection reduction layer that reduces reflectivity of the shield layer 400. The light-absorbing layer 420 that is a layer having a relatively high light absorption rate may absorb at least part of the light arriving at the shield layer 400, thereby reducing the amount of the light arriving at the first metal layer 411. In other words, at least part of the light arriving at the shield layer 400 is absorbed by the light-absorbing layer 420, and only the remaining part that is not absorbed arrives at the first metal layer 411. In some embodiments, the light absorption rate of the light-absorbing layer 420 may be greater than the light absorption rate of the first metal layer 411. Furthermore, the light-absorbing layer 420 may include a material having a high light absorption rate. For example, the light-absorbing layer 420 may include amorphous silicon.

The shield layer 400 may be patterned so as to be located only in an area except the transmission areas TA in the second display area DA2. In other words, the shield layer 400 may be located between the substrate 100 and the auxiliary pixel electrode 221a in the second display area DA2, and may have an opening 400H (see FIG. 6) that overlaps the transmission areas TA. At least one metal layer and at least one reflection reduction layer, which are included in the shield layer 400, may be also patterned to have an opening that overlaps the transmission areas TA. Furthermore, the at least one metal layer and the at least one reflection reduction layer, which are included in the shield layer 400, may be patterned in one process. In this case, when viewed in a direction perpendicular to the upper surface of the substrate 100, an edge of the at least one metal layer and an edge of the at least one reflection reduction layer, which are included in the shield layer 400, may align with, match, or overlap each other. In other words, a side surface of the at least one metal layer and a side surface of the at least one reflection reduction layer, which are included in the shield layer 400, may not have a step.

As illustrated in FIG. 7, when viewed in the direction perpendicular to the upper surface of the substrate 100, the edge of the first metal layer 411 may align with, or match, the edge of the light-absorbing layer 420. In other words, the first metal layer 411 and the light-absorbing layer 420 may be patterned in one process.

Figure 8:
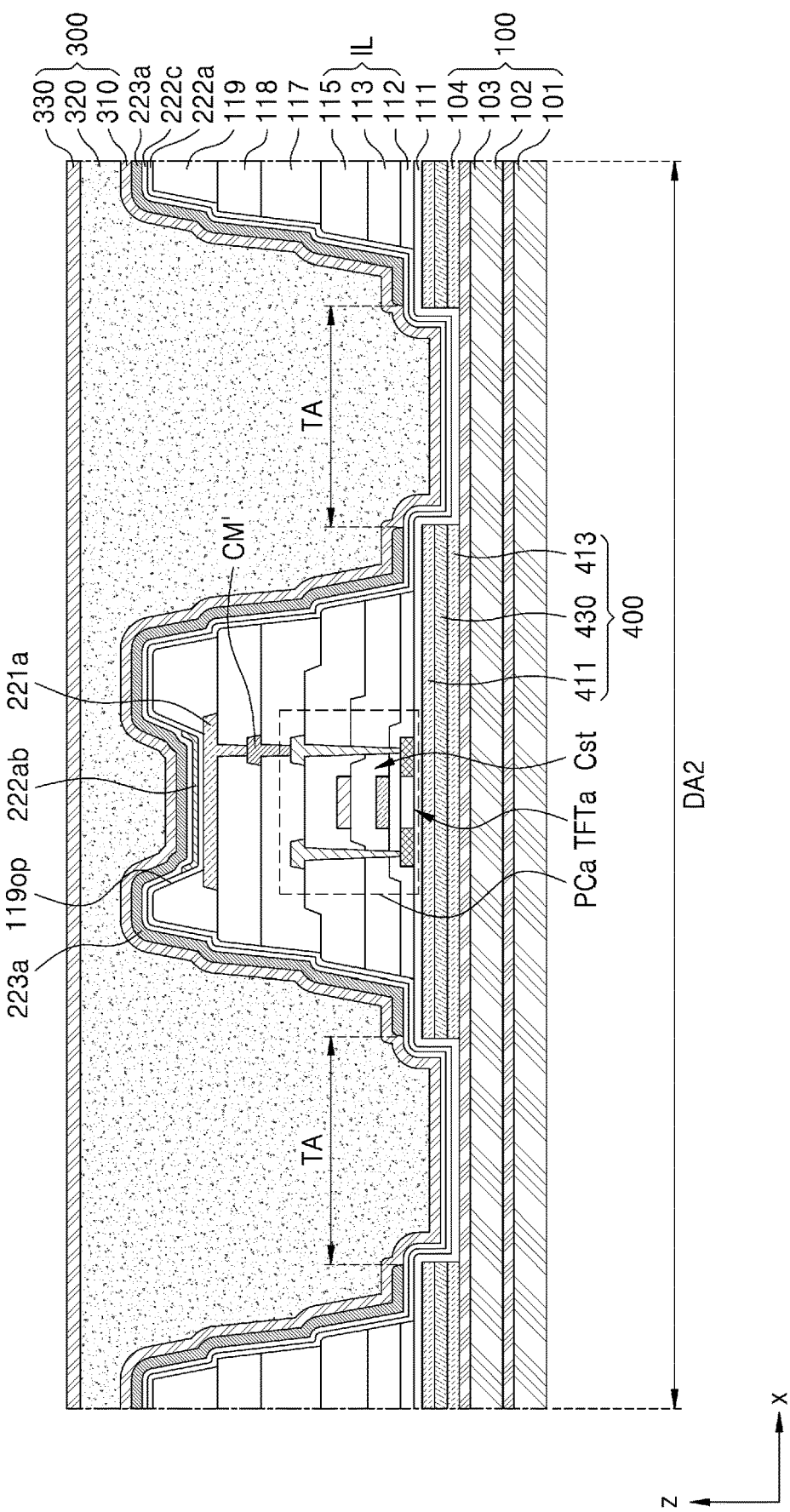
FIG. 8 is a schematic cross-sectional view of a portion of a shield layer of a display device according to other embodiments.

FIG. 8 is a schematic cross-sectional view of a portion of a shield layer of a display device according to other embodiments.

Referring to FIG. 8, the shield layer 400 may include the first metal layer 411, a second metal layer 413 located under the first metal layer 411, and an inorganic material layer 430 located between the first metal layer 411 the second metal layer 413. In other words, the shield layer 400, as the reflection reduction layer, may include the second metal layer 413 and the inorganic material layer 430.

The second metal layer 413 may reduce the reflectivity of the shield layer 400 by using a light interference phenomenon. An interference phenomenon is a phenomenon in which, when two or more wavelengths simultaneously arrive at one point, amplitudes of the wavelengths are reinforced or offset at the point. When two wavelengths of the same phase are overlapped with each other, a constructive interference occurs so that the amplitude thereof increases, and when two wavelengths that do not match each other are overlapped with each other, a destructive interference occurs so that the amplitude thereof decreases.

Part of the light coming from under the substrate 100 may be transmitted through the second metal layer 413, and the other part thereof may be reflected from a lower surface of the second metal layer 413. The light that is transmitted through the second metal layer 413 may arrive at the first metal layer 411, and may be reflected from the lower surface of the first metal layer 411. The light reflected from the lower surface of the first metal layer 411 and proceeding in a direction toward a lower portion of the substrate 100, and the light reflected from the lower surface of the second metal layer 413 and proceeding in the direction toward the lower portion of the substrate 100, may cause an interference phenomenon at a position where the reflected lights meet each other. The two lights may have destructive interference to be extinguished or have reduced amplitudes, so that the general reflectivity of the shield layer 400 may be reduced. The second metal layer 413 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single-layer or multilayer structure including the above material(s). Furthermore, in other embodiments, the first metal layer 411 and the second metal layer 413 may include the same material.

In some embodiments, the second metal layer 413 may have a relatively thin thickness so that the part of the light coming from under the substrate 100 is transmitted through the second metal layer 413. In detail, the thickness of the second metal layer 413 in the direction perpendicular to the upper surface of the substrate 100 may be less than the thickness of the first metal layer 411 in the direction perpendicular to the upper surface of the substrate 100. For example, the thickness of the first metal layer 411 may be greater than or equal to about 100 nm, and the thickness of the second metal layer 413 may be less than or equal to about 10 nm.

The inorganic material layer 430 located between the first metal layer 411 and the second metal layer 413 may promote the above-described destructive interference phenomenon to occur actively. The inorganic material layer 430 may have a thickness, by which the phase of the light reflected from the lower surface of the first metal layer 411 and the phase of the light reflected from the lower surface of the second metal layer 413 do not match each other, for example, to be opposite to each other. In other words, as the inorganic material layer 430 is interposed between the first metal layer 411 and the second metal layer 413, an interval between the first metal layer 411 and the second metal layer 413 may be controlled. Furthermore, in other embodiments, the inorganic material layer 430 may include a retarder. The retarder may be of a film type or a liquid crystal coating type, and may include a $\lambda/2$ retarder and/or a $\lambda/4$ retarder. The inorganic material layer 430 may be a single layer or multilayered, and may include an inorganic material, such as a silicon nitride, a silicon oxynitride, and/or a silicon oxide.

As illustrated in FIG. 8, when viewed in the direction perpendicular to the upper surface of the substrate 100, the edges of the first metal layer 411, the inorganic material layer 430, and the second metal layer 413 may align or match one another. In other words, the first metal layer 411, the inorganic material layer 430, and the second metal layer 413 may be patterned in one process.

Figure 9:
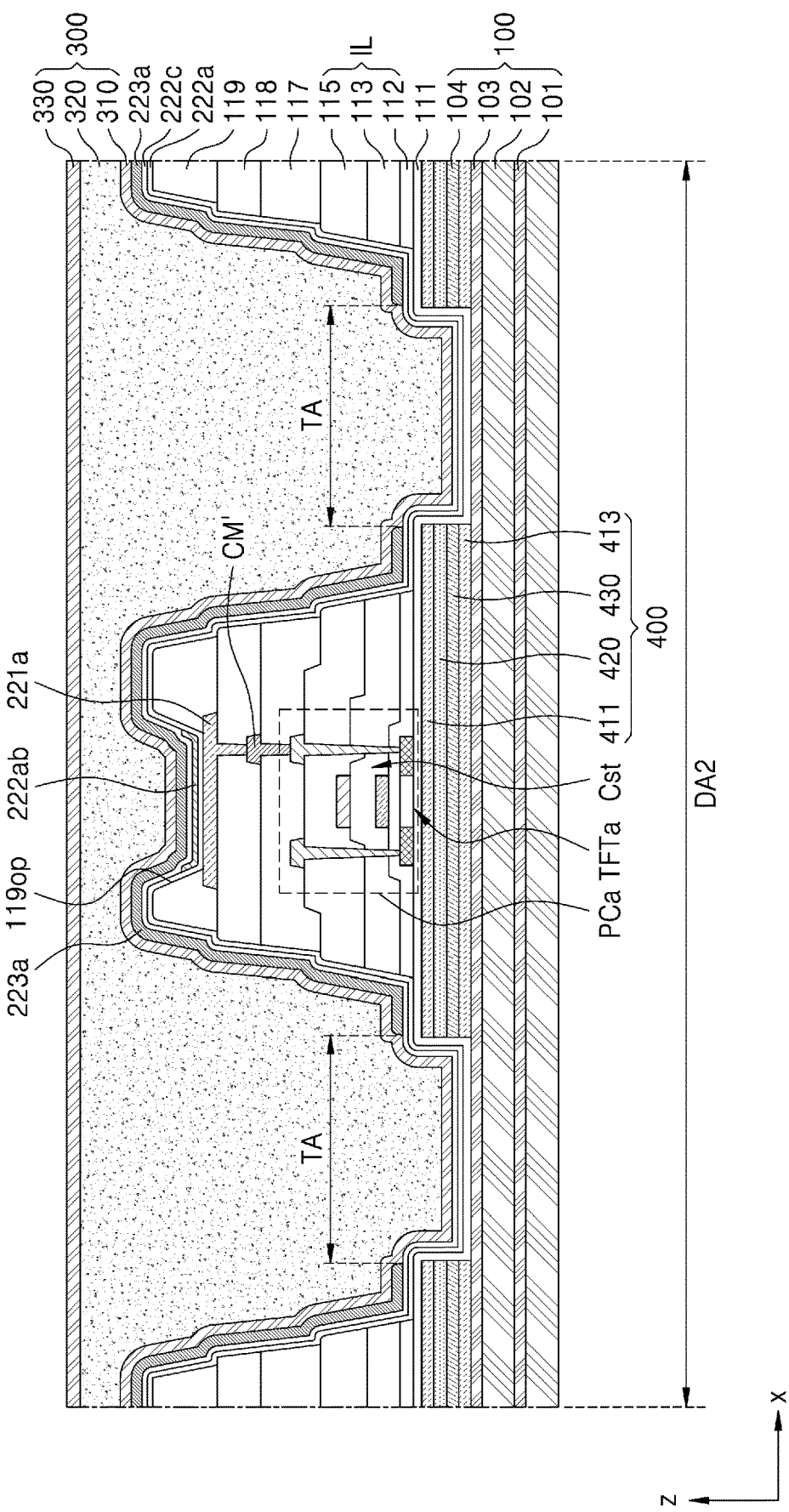
FIG. 9 is a schematic cross-sectional view of a portion of a shield layer of a display device according to other embodiments.

FIG. 9 is a schematic cross-sectional view of a portion of a shield layer of a display device according to other embodiments.

The shield layer 400 of FIG. 9 may be interpreted such that the shield layer 400 of FIG. 8 further includes the light-absorbing layer 420 located between the first metal layer 411 and the inorganic material layer 430. Referring to FIG. 9, the shield layer 400 may have a structure in which the second metal layer 413, the inorganic material layer 430, the light-absorbing layer 420, and the first metal layer 411 are sequentially stacked. In other words, the shield layer 400, as the reflection reduction layer, may include the second metal layer 413, the inorganic material layer 430, and the light-absorbing layer 420.

According to some embodiments, as the first metal layer 411, the second metal layer 413, and the inorganic material layer 430 perform the same functions as those described above, the reflectivity of the shield layer 400 may be reduced, and simultaneously or concurrently, as the light-absorbing layer 420 absorbs part of the light transmitted through the second metal layer 413, the amount of light arriving at the first metal layer 411 may be fundamentally reduced.

In some embodiments, the light absorption rate of the light-absorbing layer 420 may be higher than the light absorption rate of the first metal layer 411, the light absorption rate of a second metal layer 413, and/or the light absorption rate of the inorganic material layer 430. Furthermore, the light-absorbing layer 420 may include a material having a high rate of light absorption. For example, the light-absorbing layer 420 may include amorphous silicon.

As illustrated in FIG. 9, when viewed in the direction perpendicular to the upper surface of the substrate 100, the edges of the first metal layer 411, the light-absorbing layer 420, the inorganic material layer 430, and the second metal layer 413 may align or match one another. In other words, the first metal layer 411, the light-absorbing layer 420, the inorganic material layer 430, and the second metal layer 413 may be patterned in one process.

Figure 10:
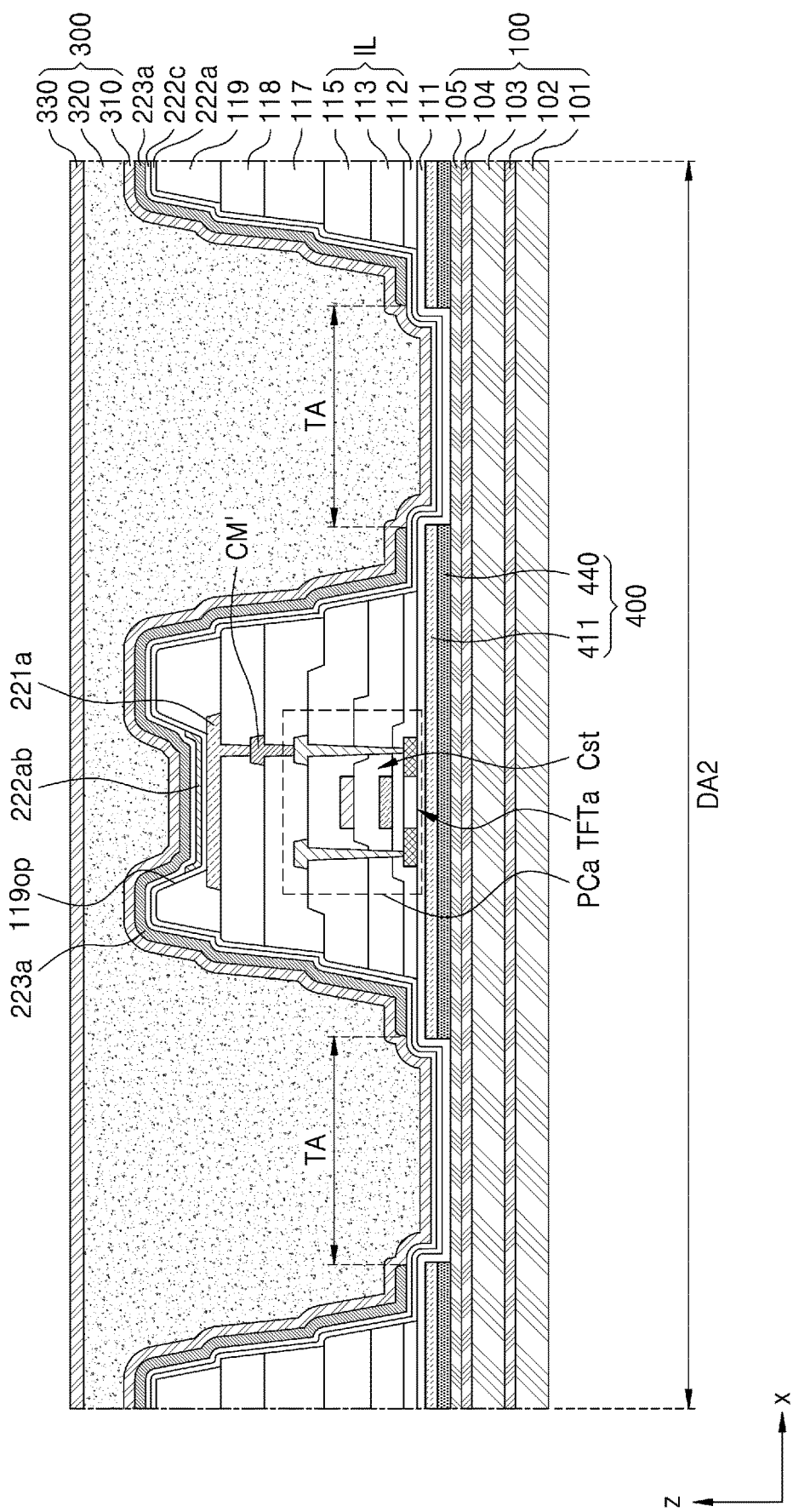
FIG. 10 is a schematic cross-sectional view of a portion of a shield layer of a display device according to other embodiments.

FIG. 10 is a schematic cross-sectional view of a portion of a shield layer of a display device according to other embodiments.

Referring to FIG. 10, the substrate 100 may include the first base layer 101, the first barrier layer 102 located on the first base layer 101, the second base layer 103 located on the first barrier layer 102, the second barrier layer 104 located on the second base layer 103, and a third barrier layer 105 located on the second barrier layer 104. The third barrier layer 105 may be a low refractive layer having a relatively low refractive index. Furthermore, the shield layer 400 may include the first metal layer 411 and a high refractive layer 440 located between the first metal layer 411 and the third barrier layer 105 as the reflection reduction layer.

In some embodiments, the refractive index of the third barrier layer 105 may be less than the refractive index of the second barrier layer 104. Furthermore, a difference between the refractive index of the second barrier layer 104 and the refractive index of the third barrier layer 105 may be greater than or equal to a preset value. For example, the difference between the refractive index of the second barrier layer 104 and the refractive index of the third barrier layer 105 may be about 0.3 or more.

The high refractive layer 440 may be a layer having a relatively high refractive index. The high refractive layer 440 is located on the third barrier layer 105. Accordingly, the second barrier layer 104, the third barrier layer 105, and the high refractive layer 440 may constitute an anti-reflection (AR) coating structure. In detail, the AR coating structure is a structure to reduce reflectivity by controlling an optical path length. The AR coating structure makes a relative phase shift between lights reflected from upper and lower boundaries of a thin film to be 180 degrees out of phase so that offset interference may be actively generated. The AR coating may be such that an optical path length of the thin film is an odd integer multiple of $\lambda/4$. In this state, $\lambda$ may mean a wavelength or design wavelength that is optimized for the maximum performance such that a path difference between the reflected beams is $\lambda/2$. Furthermore, the refractive index of the thin film that is suitable to efficiently offset the reflected light may be calculated using the refractive index of an upper layer of the thin film and the refractive index of a lower layer of the thin film. For example, the square of the refractive index of the thin film may be a product of the refractive index of the upper layer of the thin film and the refractive index of the lower layer of the thin film.

Referring to FIG. 10, the second barrier layer 104 having a relatively high refractive index, the third barrier layer 105 having a refractive index that is less than the refractive index of the second barrier layer 104, and the high refractive layer 440 having a refractive index that is greater than the refractive index of the third barrier layer 105 are sequentially stacked so as to constitute the AR coating structure. The respective thicknesses and refractive indexes of the second barrier layer 104, the third barrier layer 105, and the high refractive layer 440 may be changed in various ways according to the design so that the offset interference may be increased.

In some embodiments, a difference between the refractive index of the third barrier layer 105 and the refractive index of the second barrier layer 104 may be greater than or equal to a value (e.g., a preset value). For example, the difference between the refractive index of the third barrier layer 105 and the refractive index of the second barrier layer 104 may be about 0.3 or more. Furthermore, a difference between the refractive index of the third barrier layer 105 and the refractive index of the high refractive layer 440 may be greater than or equal to a value (e.g., a preset value). For example, the difference between the refractive index of the third barrier layer 105 and the refractive index of the high refractive layer 440 may be about 0.3 or more.

As illustrated in FIG. 10, when viewed in the direction perpendicular to the upper surface of the substrate 100, the edge of the first metal layer 411 and the edge of the high refractive layer 440 may align or match each other. In other words, the first metal layer 411 and the high refractive layer 440 may be patterned in one process.

Figure 11:
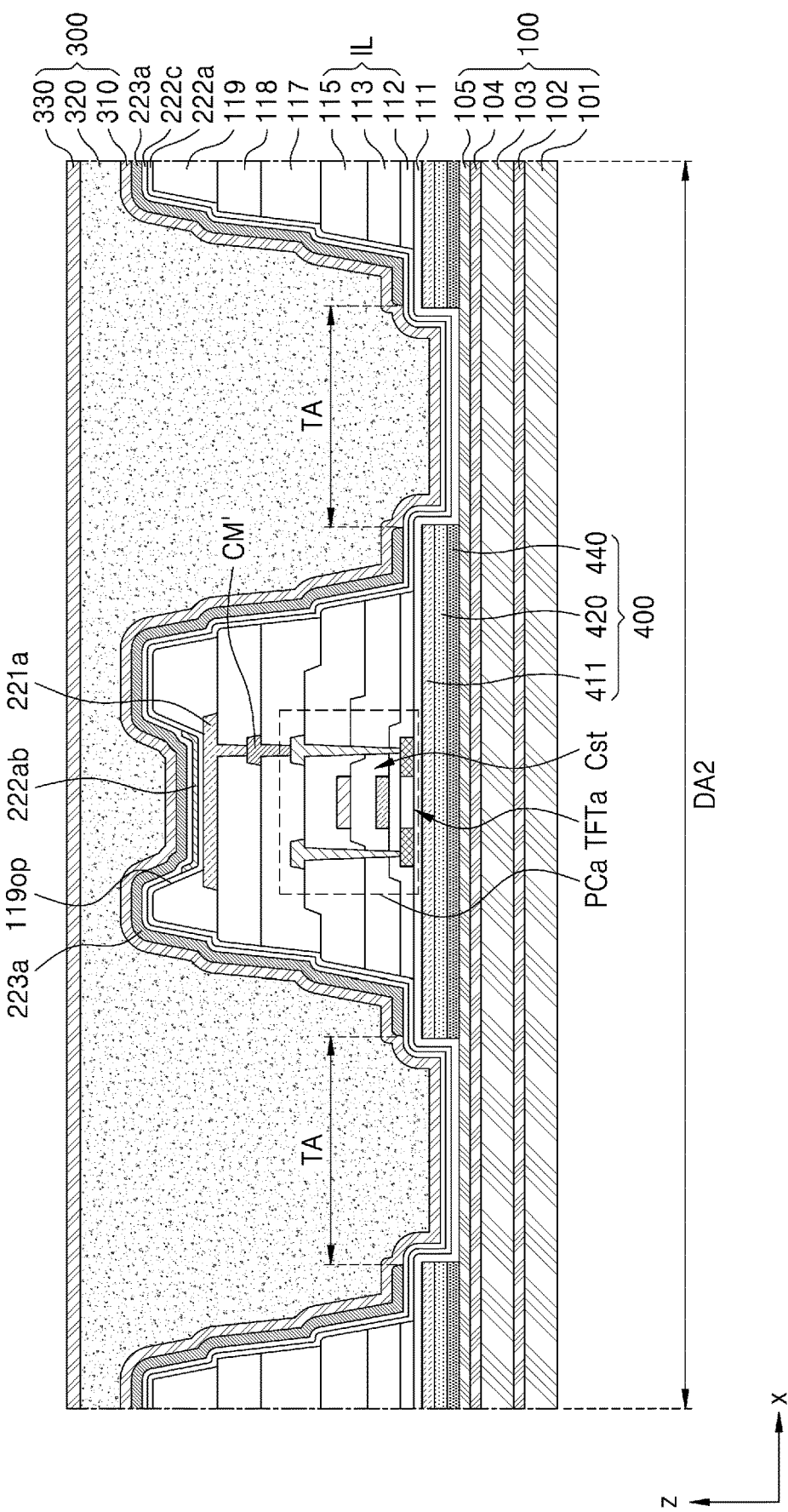
FIG. 11 is a schematic cross-sectional view of a portion of a shield layer of a display device according to other embodiments.

FIG. 11 is a schematic cross-sectional view of a portion of a shield layer of a display device according to other embodiments.

The shield layer 400 of FIG. 11 may be interpreted such that the shield layer 400 of FIG. 10 further includes the light-absorbing layer 420 located between the first metal layer 411 and the high refractive layer 440. Referring to FIG. 11, the shield layer 400 may have a structure in which the high refractive layer 440, the light-absorbing layer 420, and the first metal layer 411 are sequentially stacked. In other words, the shield layer 400, as the reflection reduction layer, may include the light-absorbing layer 420 and the high refractive layer 440.

According to some embodiments, as the second barrier layer 104, the third barrier layer 105, and the high refractive layer 440 perform the same functions as those described above, the reflectivity of the shield layer 400 may be reduced, and concurrently or simultaneously, as the light-absorbing layer 420 absorbs part of the light coming from under the substrate 100, the amount of light arriving at the first metal layer 411 may be fundamentally reduced.

In some embodiments, the light absorption rate of the light-absorbing layer 420 may be greater than the light absorption rate of the first metal layer 411, and/or the light absorption rate of the high refractive layer 440. Furthermore, the light-absorbing layer 420 may include a material having a high light absorption rate. For example, the light-absorbing layer 420 may include amorphous silicon.

As illustrated in FIG. 11, when viewed in the direction perpendicular to the upper surface of the substrate 100, the edge of the first metal layer 411, the edge of the light-absorbing layer 420, and the edge of the high refractive layer 440 may align or match each other. In other words, the first metal layer 411, the light-absorbing layer 420 and the high refractive layer 440 may be patterned in one process.

Figure 12:
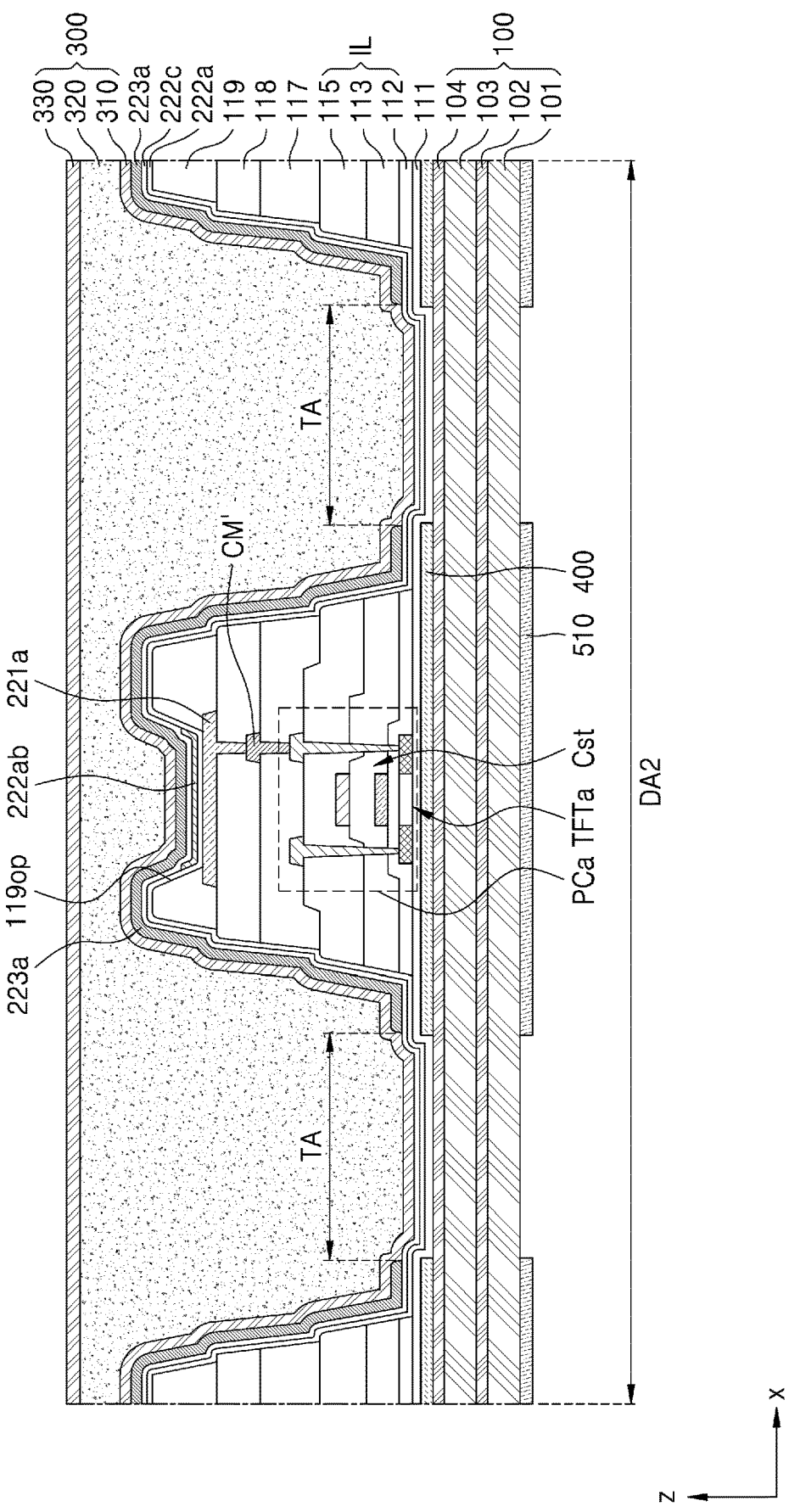
FIG. 12 is a schematic cross-sectional view of a portion of a lower surface absorption layer of a display device according to some embodiments.

FIG. 12 is a schematic cross-sectional view of a portion of a lower surface absorption layer of a display device according to some embodiments.

Referring to FIG. 12, a display device according to some embodiments may further include a lower surface absorption layer 510 located on a lower surface of the substrate 100. The lower surface absorption layer 510 may absorb at least part of light coming from under the substrate 100 to reduce the amount of light introduced into the substrate 100. The lower surface absorption layer 510 may include a material having a high light absorption rate. For example, the lower surface absorption layer 510 may include a molybdenum tantalum oxide (MTO).

The lower surface absorption layer 510 may overlap the shield layer 400, when viewed in the direction perpendicular to the upper surface of the substrate 100. In some embodiments, the lower surface absorption layer 510 may be patterned to have the same pattern as the shield layer 400. The lower surface absorption layer 510, like the shield layer 400, may have an opening corresponding to the transmission areas TA in the second display area DA2. Accordingly, the lower surface absorption layer 510 may selectively absorb only light introduced into an area that is other than the transmission areas TA in the second display area DA2, and might not absorb the light introduced into the transmission areas TA. Accordingly, the light generated from the component 40 (see FIG. 6) arranged under the substrate 100 might not be absorbed, but may be transmitted through the transmission areas TA and may arrive at an upper portion of the substrate 100, and the light generated from the upper portion of the substrate 100 may arrive at the component 40 arranged under the substrate 100.

Figure 13:
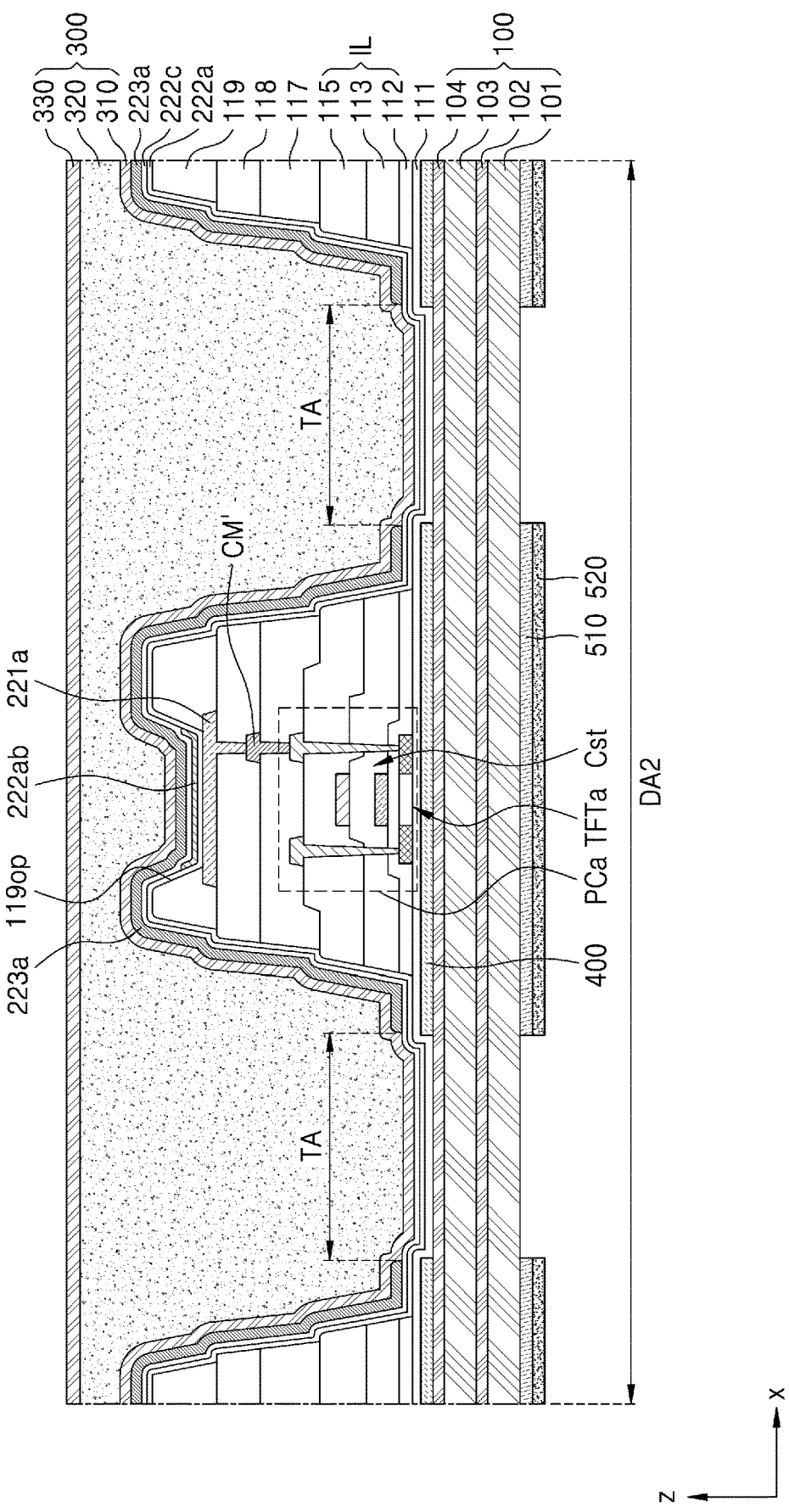
FIG. 13 is a schematic cross-sectional view of a portion of a lower surface absorption layer of a display device according to other embodiments.

FIG. 13 is a schematic cross-sectional view of a portion of a lower surface absorption layer of a display device according to other embodiments.

The display device of FIG. 13 may be interpreted such that the display device of FIG. 12 further includes a lower surface inorganic material layer 520. Referring to FIG. 13, the lower surface inorganic material layer 520 may be further provided on a lower surface of the lower surface absorption layer 510. The lower surface inorganic material layer 520 may reduce or prevent damage to the lower surface absorption layer 510 by covering the lower surface of the lower surface absorption layer 510. The lower surface inorganic material layer 520 may be a single layer or multilayered, and may include an inorganic material such as a silicon nitride, a silicon oxynitride, and/or a silicon oxide. Furthermore, in other embodiments, the lower surface inorganic material layer 520 may include the same material as the inorganic material layer 430 included in the shield layer 400 (discussed above with respect to FIG. 9).

As illustrated in FIG. 13, when viewed in the direction perpendicular to the upper surface of the substrate 100, the edge of the lower surface absorption layer 510 and the edge of the lower surface inorganic material layer 520 may align or match each other. In other words, the lower surface absorption layer 510 and the lower surface inorganic material layer 520 may be patterned in one process.

As illustrated in FIGS. 12 and 13, even when the display device further includes the lower surface absorption layer 510, the above-described various embodiments with respect to the shield layer 400 may be applied in the same manner. In this case, the amount of light introduced into the upper portion of the substrate 100 is reduced by the lower surface absorption layer 510, while also preventing or reducing the remaining light that is not absorbed by the lower surface absorption layer 510, but is instead introduced into the upper portion of the substrate 100, that would otherwise arrive at the shield layer 400 to be reflected back in a direction toward the component 40.

Figure 14:
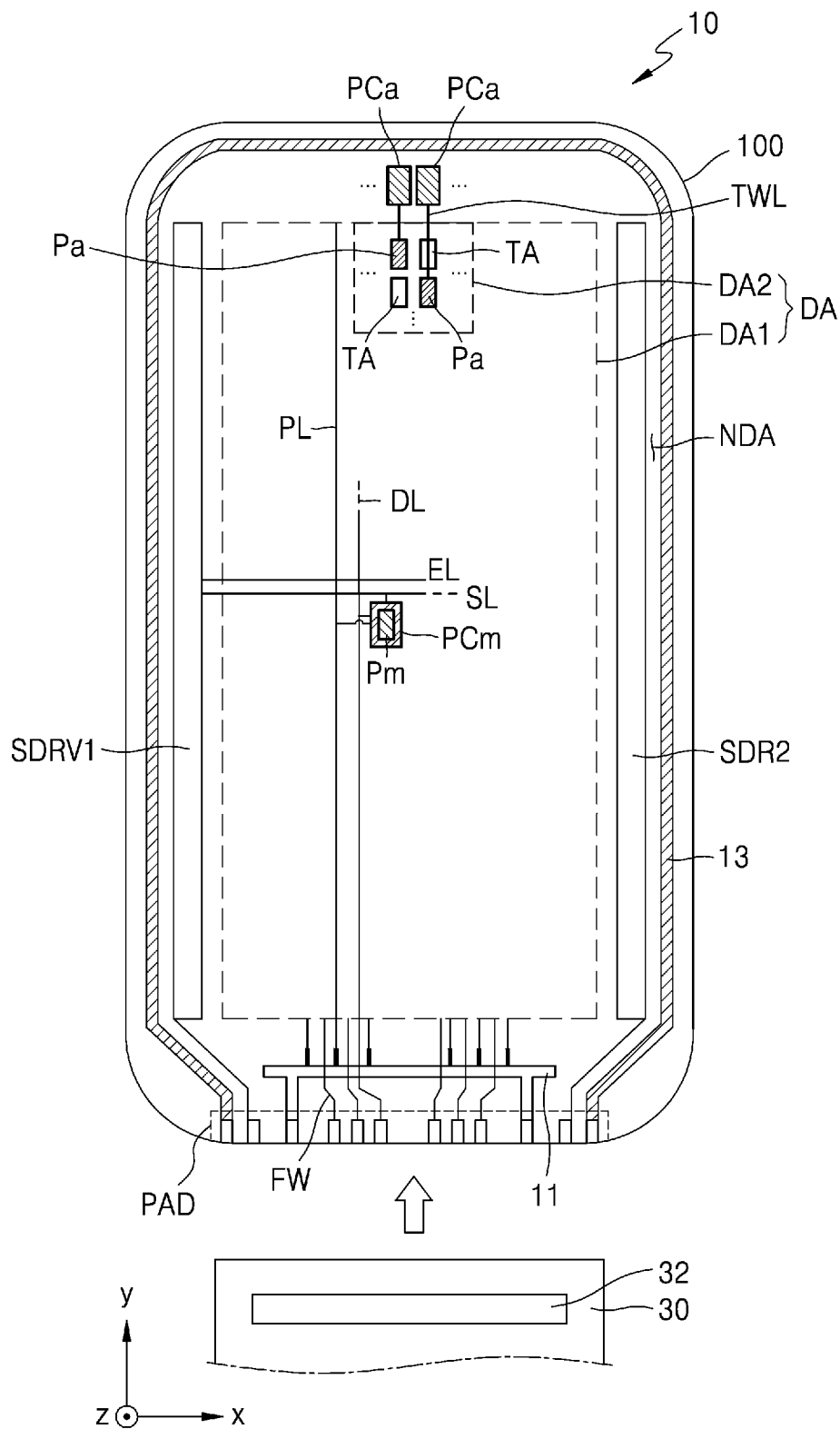
FIG. 14 is a schematic plan view of a portion of a display panel of a display device according to some embodiments.
Figure 15:
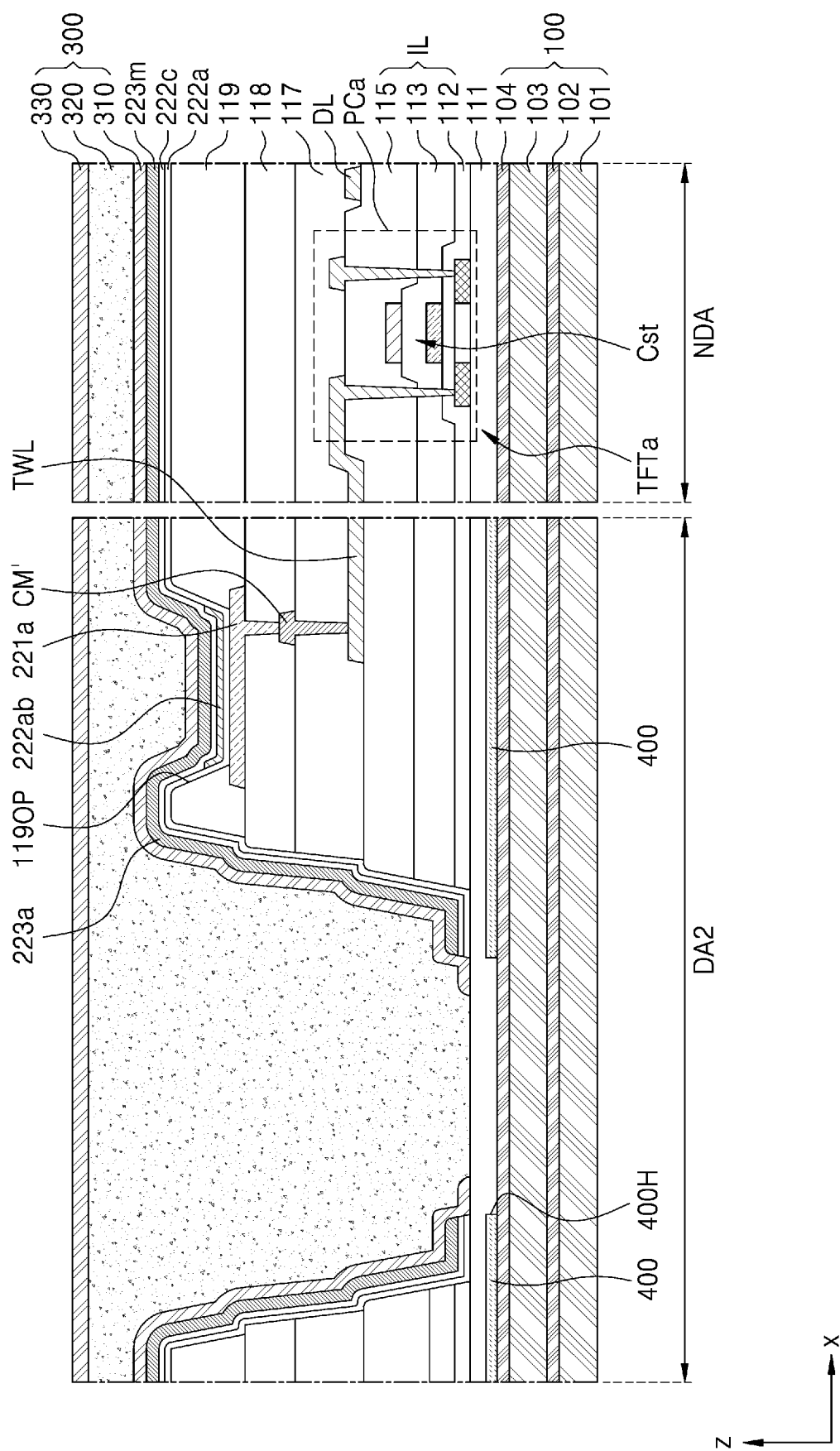
FIG. 15 is a schematic cross-sectional view of a portion of a display device according to some embodiments.

FIG. 14 is a schematic plan view of a portion of a display panel of a display device according to some embodiments, and FIG. 15 is a schematic cross-sectional view of a portion of a display device according to some embodiments.

Although, in the above description, the auxiliary pixel circuit PCa electrically connected to the auxiliary sub-pixel Pa in the second display area DA2 is described to be located in the second display area DA2, the disclosure is not limited thereto. In other words, as illustrated in FIG. 14, the auxiliary pixel circuit PCa electrically connected to the auxiliary sub-pixel Pa located in the second display area DA2 may be located on the non-display area NDA. The auxiliary pixel circuit PCa may include the auxiliary thin film transistor TFTa including an auxiliary semiconductor layer and an auxiliary gate electrode.

In this case, the main sub-pixels Pm are arranged in the first display area DA1. The main pixel circuit PCm for driving the main sub-pixel Pm may be arranged in the first display area DA1, and the main pixel circuit PCm may be arranged to overlap the main sub-pixel Pm. The auxiliary pixel circuit PCa for driving the auxiliary sub-pixels Pa of the second display area DA2 may be arranged in the non-display area NDA adjacent to the second display area DA2. In detail, the main thin film transistors TFTm including a main semiconductor layer and a main gate electrode, and electrically connected to the main pixel electrodes 221m, may be located above the substrate 100 in the first display area DA1, and the auxiliary thin film transistors TFTa including an auxiliary semiconductor layer and an auxiliary gate electrode may be located above the substrate 100 in the non-display area NDA. Furthermore, connection wirings TWL for electrically connecting the auxiliary thin film transistors TFTa to the auxiliary pixel electrodes 221a may be provided.

As in FIG. 14, when the second display area DA2 is arranged in an upper portion of the display area DA (+y direction), the auxiliary pixel circuit PCa may be arranged above the non-display area NDA. A display element included in the auxiliary sub-pixel Pa may be connected to the auxiliary pixel circuit PCa by a connection wiring TWL extending in one direction (for example, a y direction). Although FIG. 14 illustrates that the auxiliary pixel circuit PCa is located in an upper side of the first display area DA1, the disclosure is not limited thereto. For example, the auxiliary pixel circuit PCa may be variously modified, for example, to be located at the left side (−x direction) or right side (+x direction) of the first display area DA1.

As such, when the auxiliary pixel circuit PCa electrically connected to the auxiliary sub-pixel Pa located in the second display area DA2 is located above the non-display area NDA, the auxiliary pixel electrode 221a may be connected to the auxiliary pixel circuit PCa located in the non-display area NDA through the connection wiring TWL.

In some embodiments, as illustrated in FIG. 15, the connection wiring TWL may include the same material as, and may have the same layer structure as, a source electrode S1 of the auxiliary pixel circuit PCa. In other words, the connection wiring TWL may be formed as the source electrode S1 located in the non-display area NDA and extending from the non-display area NDA to the second display area DA2. The connection wiring TWL is not limited to the above-described example, and may include a plurality of connection wirings. In this state, when a plurality of connection wirings are arranged in different layers, the connection wirings may be connected via a contact hole. Furthermore, the connection wiring TWL may include a material that is different from the auxiliary pixel electrode 221a and may have a different layer structure.

Although, in the above description, only the display device and the electronic apparatus are mainly described, the disclosure is not limited thereto. For example, a display device manufacturing method or electronic apparatus manufacturing method to manufacture the display device and the electronic apparatus may belong to the scope of the disclosure.

According to some embodiments of the disclosure configured as above, a display device having a transmission area, in which display quality and performance of a component are improved by controlling the reflected light, and an electronic apparatus, may be implemented. The scope of the disclosure is not limited by the above aspects.

It should be understood that embodiments described herein should be considered in a descriptive sense only and not for purposes of limitation. Descriptions of features or aspects within the embodiments should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with the functional equivalents thereof to be included therein.

What is claimed is:

1. A display device comprising:
a substrate comprising a first display area, a second display area comprising transmission areas, and a non-display area;
main pixel electrodes above the first display area;
auxiliary pixel electrodes above the second display area;
auxiliary emission layers respectively above the auxiliary pixel electrodes;
auxiliary counter electrodes respectively above the auxiliary emission layers; and
a shield layer between the substrate and the auxiliary pixel electrodes, overlapping an entirety of the auxiliary counter electrodes, defining openings respectively overlapping the transmission areas, and comprising:
a first metal layer; and
at least one reflection reduction layer overlapping the first metal layer, and comprising:
a second metal layer under the first metal layer, and having a thickness in a thickness direction that is perpendicular to an upper surface of the substrate of about 10 nm or less; and
an inorganic material layer comprising a retarder between the first metal layer and the second metal layer.

2. The display device of claim 1, wherein the at least one reflection reduction layer comprises a light-absorbing layer between the first metal layer and the substrate, and having a light absorption rate that is greater than a light absorption rate of the first metal layer.

3. The display device of claim 2, wherein the light-absorbing layer comprises amorphous silicon.

4. The display device of claim 2, wherein, when viewed in the thickness direction, an edge of the first metal layer is aligned with an edge of the light-absorbing layer.

5. The display device of claim 1, wherein the thickness of the second metal layer in the thickness direction is less than a thickness of the first metal layer in the thickness direction.

6. The display device of claim 5, wherein the first metal layer and the second metal layer comprise a same material.

7. The display device of claim 1, wherein the at least one reflection reduction layer further comprises a light-absorbing layer between the first metal layer and the inorganic material layer, and having a light absorption rate that is greater than a light absorption rate of the first metal layer.

8. The display device of claim 7, wherein the light-absorbing layer comprises amorphous silicon.

9. The display device of claim 7, wherein, when viewed in the thickness direction, an edge of the first metal layer is aligned with an edge of the light-absorbing layer and with an edge of the inorganic material layer.

10. An electronic apparatus comprising:
a display panel comprising a first display area, a second display area comprising transmission areas, and a non-display area; and
a component overlapping the second display area, wherein the display panel comprises:
- a substrate;
- main pixel electrodes above the first display area;
- auxiliary pixel electrodes above the second display area;
- auxiliary emission layers respectively above the auxiliary pixel electrodes;
- auxiliary counter electrodes respectively above the auxiliary emission layers; and
- a shield layer between the substrate and the auxiliary pixel electrodes, overlapping an entirety of the auxiliary counter electrodes, defining openings respectively overlapping the transmission areas, and comprising a first metal layer, and at least one reflection reduction layer overlapping the first metal layer and comprising:
  - a second metal layer under the first metal layer, and having a thickness in a thickness direction that is perpendicular to an upper surface of the substrate of about 10 nm or less; and
  - an inorganic material layer comprising a retarder between the first metal layer and the second metal layer.

11. The electronic apparatus of claim 10, wherein the at least one reflection reduction layer comprises a light-absorbing layer between the first metal layer and the substrate, and having a light absorption rate that is greater than a light absorption rate of the first metal layer.

* * * * *